United States Patent
Kudoh

(10) Patent No.: US 11,211,412 B2
(45) Date of Patent: Dec. 28, 2021

(54) IMAGING DEVICE AND ELECTRONIC APPARATUS

(71) Applicant: SONY SEMICONDUCTOR SOLUTIONS CORPORATION, Kanagawa (JP)

(72) Inventor: Yoshiharu Kudoh, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 45 days.

(21) Appl. No.: 16/610,683

(22) PCT Filed: Jun. 5, 2018

(86) PCT No.: PCT/JP2018/021440
§ 371 (c)(1),
(2) Date: Nov. 4, 2019

(87) PCT Pub. No.: WO2018/235584
PCT Pub. Date: Dec. 27, 2018

(65) Prior Publication Data
US 2020/0168648 A1  May 28, 2020

(30) Foreign Application Priority Data
Jun. 19, 2017 (JP) .............................. JP2017-119251

(51) Int. Cl.
*H01L 27/146* (2006.01)
(52) U.S. Cl.
CPC .... *H01L 27/14614* (2013.01); *H01L 27/1463* (2013.01); *H01L 27/14634* (2013.01); *H01L 27/14623* (2013.01); *H01L 27/14627* (2013.01)

(58) Field of Classification Search
CPC ........... H01L 27/14614; H01L 27/1463; H01L 27/14634; H01L 27/14623; H01L 27/14627
(Continued)

(56) References Cited

U.S. PATENT DOCUMENTS

2009/0303371 A1 * 12/2009 Watanabe ......... H01L 27/14641
  348/311
2010/0084695 A1   4/2010 Park
(Continued)

FOREIGN PATENT DOCUMENTS

EP  2133918  12/2009
GB  2537421  10/2016
(Continued)

OTHER PUBLICATIONS

International Search Report and Written Opinion prepared by the European Patent Office dated Sep. 6, 2018, for International Application No. PCT/JP2018/021440.
(Continued)

*Primary Examiner* — Igwe U Anya
(74) *Attorney, Agent, or Firm* — Sheridan Ross P.C.

(57) ABSTRACT

An imaging device includes a plurality of pixel transistors at a substrate surface of a semiconductor substrate, an element isolation region that isolates the plurality of pixel transistors from each other, a charge storage region at a deeper position in the semiconductor substrate than the substrate surface, and a charge discharge layer of the same conductivity type as the charge storage region. The charge discharge layer is arranged between the element isolation region and the charge storage region.

20 Claims, 23 Drawing Sheets

(58) Field of Classification Search
USPC .......................................................... 257/292
See application file for complete search history.

(56) References Cited

U.S. PATENT DOCUMENTS

| | | |
|---|---|---|
| 2011/0298079 A1 | 12/2011 | Kawahito |
| 2013/0020468 A1* | 1/2013 | Mitsuhashi ....... H01L 27/14623 |
| | | 250/208.1 |
| 2014/0151533 A1 | 6/2014 | Watanabe et al. |
| 2016/0056198 A1 | 2/2016 | Lee et al. |
| 2016/0307948 A1 | 10/2016 | Stark |
| 2017/0040365 A1 | 2/2017 | Lee et al. |
| 2019/0371844 A1* | 12/2019 | Furukawa ............ H04N 5/2254 |

FOREIGN PATENT DOCUMENTS

| | | |
|---|---|---|
| JP | 2010-114274 | 5/2010 |
| JP | 2015-029054 | 2/2015 |
| WO | WO 2010/074252 | 7/2010 |

OTHER PUBLICATIONS

Official Action (with English translation) for Japanese Patent Application No. 2017-119251, dated Nov. 24, 2020, 10 pages.

* cited by examiner

IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2018/021440 having an international filing date of 5 Jun. 2018, which designated the United States, which PCT application claimed the benefit of Japanese Patent Application No. 2017-119251 filed 19 Jun. 2017, the entire disclosures of each of which are incorporated herein by reference.

TECHNICAL FIELD

The present technology relates to an imaging device and an electronic apparatus and more particularly to an imaging device and an electronic apparatus which are enabled to reduce dark current generated at the bottom of an element isolation region.

BACKGROUND ART

In general, a structure in which a photodiode and a transistor group necessary for read-out operations are in the same plane is used as a pixel structure of a CMOS image sensor. However, in this case, as the pixel becomes smaller, the area ratio of the photodiode lowers. Therefore, it is difficult to ensure an amount of charge handled.

In order to increase the amount of charge handled, it is necessary to strengthen the electric field of the PN junction of the photodiode or to enlarge the junction area.

Strengthening the junction electric field leads to an increase in dark leakage caused by crystalline defects, metal impurities, and the like, that is, white spot defects. White spot defects change exponentially with the growth of the electric field. Therefore, there is a limit on strengthening the electric field.

Also with an increased junction area, constant dark leakage, that is, dark current an increases in proportion to the area. In this case, the electric field can be weakened. Therefore, it is possible to reduce white spot defects. Since dark current can be sufficiently lowered in recent image sensor processes, the ability of reducing white spot defects is more favorable.

In such circumstances, for example, Patent Literature 1 has proposed a structure in which deep trenches are formed at pixel boundaries and high-concentration P-type layers are formed in sidewalls thereof, such that electric fields are easily generated. With this structure, a photodiode is not formed in a substrate surface. Charges are accumulated at junctions of the trench sidewalls. With a pixel dimension of about 5 µm or less, the sidewalls can make the junction area larger in comparison with a case where the photodiode is formed in the substrate surface. Therefore, with approximately the same accumulated charge amount, the former can also weaken the junction electric field.

CITATION LIST

Patent Literature

PTL 1: Japanese Patent Application Laid-open No. 2015-162603

SUMMARY OF INVENTION

Technical Problem

Regarding the increase in charge amount due to the growth of the junction area, there is a fear that dark current may increase as described above. However, Patent Literature 1 has proposed a method of forming a high-concentration P-type with the sidewalls. Therefore, it is highly probable that dark current can be sufficiently reduced.

However, it is difficult to greatly increase the P-type concentration at an interface of an STI bottom that is an element isolation region of a transistor formed above the photodiode. Therefore, there is a fear that dark current generated in this region may increase.

The present technology has been made in view of the above-mentioned circumstances to be capable of reducing dark current generated at the bottom of an element isolation region.

Solution to Problem

In accordance with a first embodiment of the present technology, there is provided an imaging device, comprising a plurality of pixel transistors at a substrate surface of a semiconductor substrate; an element isolation region that isolates the plurality of pixel transistors from each other; a charge storage region at a deeper position in the semiconductor substrate than the substrate surface; and a charge discharge layer of the same conductivity type as the charge storage region, wherein the charge discharge layer is arranged between the element isolation region and the charge storage region.

The charge discharge layer may be arranged below the element isolation region.

The charge discharge layer may be in a well region between the element isolation region and the charge storage region.

The charge discharge layer may be between the charge storage region and at least one of the plurality of pixel transistors that is not a transfer transistor.

The charge discharge layer may include an opening, and a gate electrode of a transfer transistor in the plurality of pixel transistors extends through the opening into the charge storage region.

The charge discharge layer may be coupled to an impurity region having a same conductivity type as the charge storage region and the impurity region may be at the substrate surface.

The impurity region may be separate from a source region and a drain region of the plurality of pixel transistors.

The impurity region may be a drain region of a reset transistor of the plurality of pixel transistors.

The impurity region may be a drain region of an amplification transistor of the plurality of pixel transistors.

The impurity region may receive a predetermined voltage.

The impurity region may be between an amplification transistor and a selection transistor of the plurality of pixel transistors.

A transfer transistor of the plurality of pixel transistors may have a trench structure in which a gate electrode extends from the substrate surface to the charge storage region. The imaging device according may further comprise an inter-pixel isolation section configured to penetrate the semiconductor substrate, the inter-pixel isolation section being arranged in a pixel boundary outside the charge storage region in a planar view. The inter-pixel isolation section may include a double-layer structure of a sidewall film and a filler inside the double-layer structure of the sidewall film.

The imaging device may further comprise: a P-type layer and an N-type layer configured to form a PN junction, the P-type layer and the N-type layer being arranged between the charge storage region and the inter-pixel isolation section.

The imaging device may further comprise a light-shielding film and an on-chip lens on a side of a surface of the semiconductor substrate that is different from a surface of the substrate surface.

In accordance with a second embodiment of the present technology, there is provided an electronic apparatus comprising an imaging device. The imaging device includes a plurality of pixel transistors at a substrate surface of a semiconductor substrate; an element isolation region that isolates the plurality of pixel transistors from each other; a charge storage region at a deeper position in the semiconductor substrate than the substrate surface; and a charge discharge layer of the same conductivity type as the charge storage region, wherein the charge discharge layer is arranged between the element isolation region and the charge storage region.

In accordance with a third embodiment of the present technology, there is provided an imaging device comprising a substrate; a charge storage region in the substrate to store charge generated by incident light; at least one transistor at a surface of the substrate and coupled to the charge storage region; an isolation region in the substrate and located adjacent to at least one side of the at least one transistor; and a charge discharge layer between the isolation region and the charge storage region, wherein the charge discharge layer discharges charge from the isolation region.

The imaging device may further comprise: an impurity region in the substrate and coupled to the charge discharge layer, wherein the isolation region is between the impurity region and the at least one transistor.

The impurity region, the charge storage region and the charge discharge layer may have a same conductivity type, and the impurity region may have a higher impurity concentration than the charge discharge layer.

The solid-state imaging apparatus and the electronic apparatus may be independent apparatuses or may be modules to be incorporated in other apparatuses.

Advantageous Effects of Invention

In accordance with the first and second embodiments of the present technology, dark current generated at the bottom of the element isolation region can be reduced.

It should be noted that the effects described here are not necessarily limitative and any effect described in the present disclosure may be provided.

BRIEF DESCRIPTION OF DRAWINGS

Embodiments of the invention will now be described with reference to the accompanying drawings, throughout which like parts are referred to by like references.

FIG. 18 is a block diagram showing a configuration example of an imaging apparatus serving as an electronic apparatus to which the present technology is applied.

DESCRIPTION OF EMBODIMENTS

Hereinafter, modes (hereinafter, referred to as embodiments) for carrying out the present technology will be described. Note that descriptions will be made in the following order.

1. Schematic Configuration Example of Solid-State Imaging Apparatus
2. Circuit Configuration Example of Pixel
3. Pixel Structure According to First Embodiment
4. Actions and Effects of N-Type Layer 97A and N-Type Layer 97B
5. Pixel Plan View
6. Pixel Structure According to Second Embodiment
7. Pixel Structure According to Third Embodiment
8. Pixel Structure According to Fourth Embodiment
9. Conclusions 10. Configuration Example of Stacked-Type Solid-State Imaging Apparatus to Which Technology According to Present Disclosure Can Be Applied
11. Example of Application to Electronic Apparatuses
12. Usage Examples of Imaging Apparatus
13. Example of Application to Internal Information Acquisition System
14. Example of Application to Movable Object 1. Schematic Configuration Example of Solid-State Imaging Apparatus FIG. 1 shows a schematic configuration of a solid-state imaging apparatus to which the technology according to the present disclosure (present technology) is applied.

Figure 1:
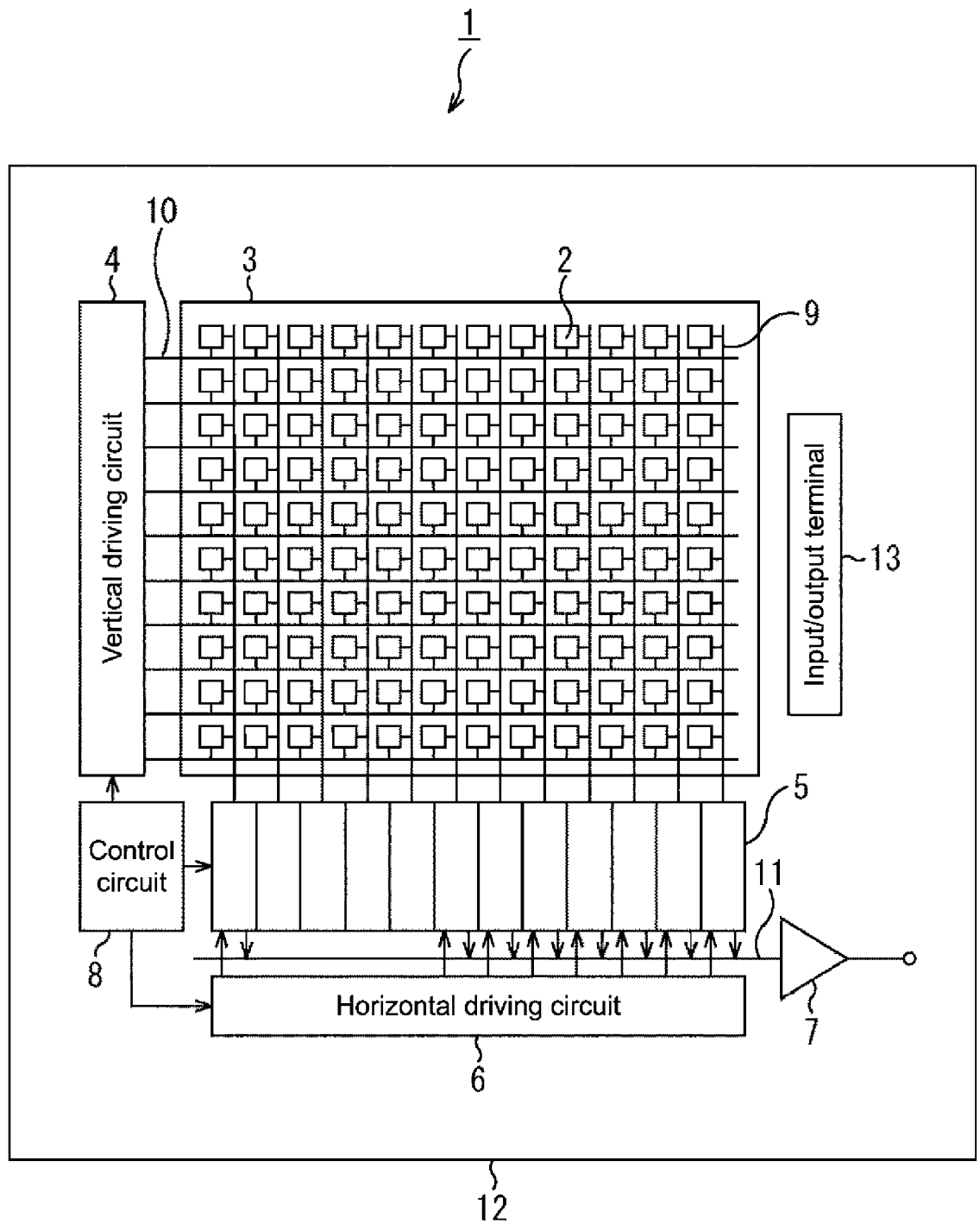
FIG. 1 is a diagram showing a schematic configuration of a solid-state imaging apparatus to which the technology according to the present disclosure is applied.

A solid-state imaging apparatus 1 of FIG. 1 includes a pixel array section 3 and a peripheral circuit section surrounding the pixel array section 3 on a semiconductor substrate 12. The semiconductor substrate 12 is made of, for example, silicon (Si) as a semiconductor. In the pixel array section 3, pixels 2 are arrayed in the form of a two-dimensional array. The peripheral circuit section includes a vertical driving circuit 4, column signal processing circuits 5, a horizontal driving circuit 6, an output circuit 7, a control circuit 8, and the like.

The pixel 2 includes a photodiode (hereinafter, referred to as PD) and a plurality of pixel transistors. The PD serves as a photoelectric conversion element. The plurality of pixel transistors include four MOS transistors of a transfer transistor, a selection transistor, a reset transistor, and an amplification transistor, for example.

Further, the pixel 2 may be formed in a pixel sharing structure. The pixel sharing structure includes a plurality of photodiodes, a plurality of transmission transistors, a shared floating diffusion (floating diffusion region), and other pixel transistors each of which is shared. In other words, the shared pixel is formed by the photodiodes and the transmission transistors, which form a plurality of unit pixels, sharing each of the other pixel transistors.

The control circuit 8 receives an input clock and data for commanding an operation mode or the like. Further, the control circuit 8 outputs data of internal information and the like of the solid-state imaging apparatus 1. That is, the control circuit 8 generates clock signals and control signals on the basis of vertical synchronization signals, horizontal synchronization signals, and master clock. Based on these clock signals and control signals, the vertical driving circuit 4, the column signal processing circuits 5, the horizontal driving circuit 6, and the like operate. Then, the control circuit 8 outputs the generated clock signals and control signals to the vertical driving circuit 4, the column signal processing circuits 5, the horizontal driving circuit 6, and the like.

The vertical driving circuit 4 includes, for example, a shift register. The vertical driving circuit 4 selects predetermined one of pixel driving wires 10, supplies the selected pixel driving wire 10 with pulses for driving the pixels 2, and drives the pixels 2 on a row-by-row basis. That is, the vertical driving circuit 4 sequentially selects and scans the pixels 2 of the pixel array section 3 on a row-by-row basis in a vertical direction. Then, the vertical driving circuit 4 supplies pixel signals based on signal charges generated in a manner that depends on the amount of light received by photoelectric conversion portions of the pixels 2 to the column signal processing circuits 5 through vertical signal lines 9.

The column signal processing circuit 5 is arranged for each column of the pixels 2. The column signal processing circuit 5 performs signal processing such as noise canceling on signals output from the pixels 2 corresponding to one row, for each pixel column. For example, the column signal processing circuit 5 performs signal processing such as correlated double sampling (CDS) for canceling fixed-pattern noise specific to the pixels and AD conversion.

The horizontal driving circuit 6 includes, for example, a shift register. The horizontal driving circuit 6 sequentially outputs horizontal scan pulses, to thereby select each of the column signal processing circuits 5 in order. The horizontal driving circuit 6 causes each of the column signal processing circuits 5 to output pixel signals to a horizontal signal line 11.

The output circuit 7 processes and outputs signals sequentially supplied from each of the column signal processing circuits 5 through the horizontal signal line 11. For example, the output circuit 7 may perform only buffering or may perform black level adjustment, column variation correction, various types of digital signal processing, and the like. An input/output terminal 13 exchanges signals with the outside.

Thus the configured solid-state imaging apparatus 1 is a CMOS image sensor. In the CMOS image sensor, the signal processing circuit 5 that performs CDS processing and AD conversion processing is arranged for each pixel column. Such a system is called column AD system.

2. Circuit Configuration Example of Pixel

Figure 2:
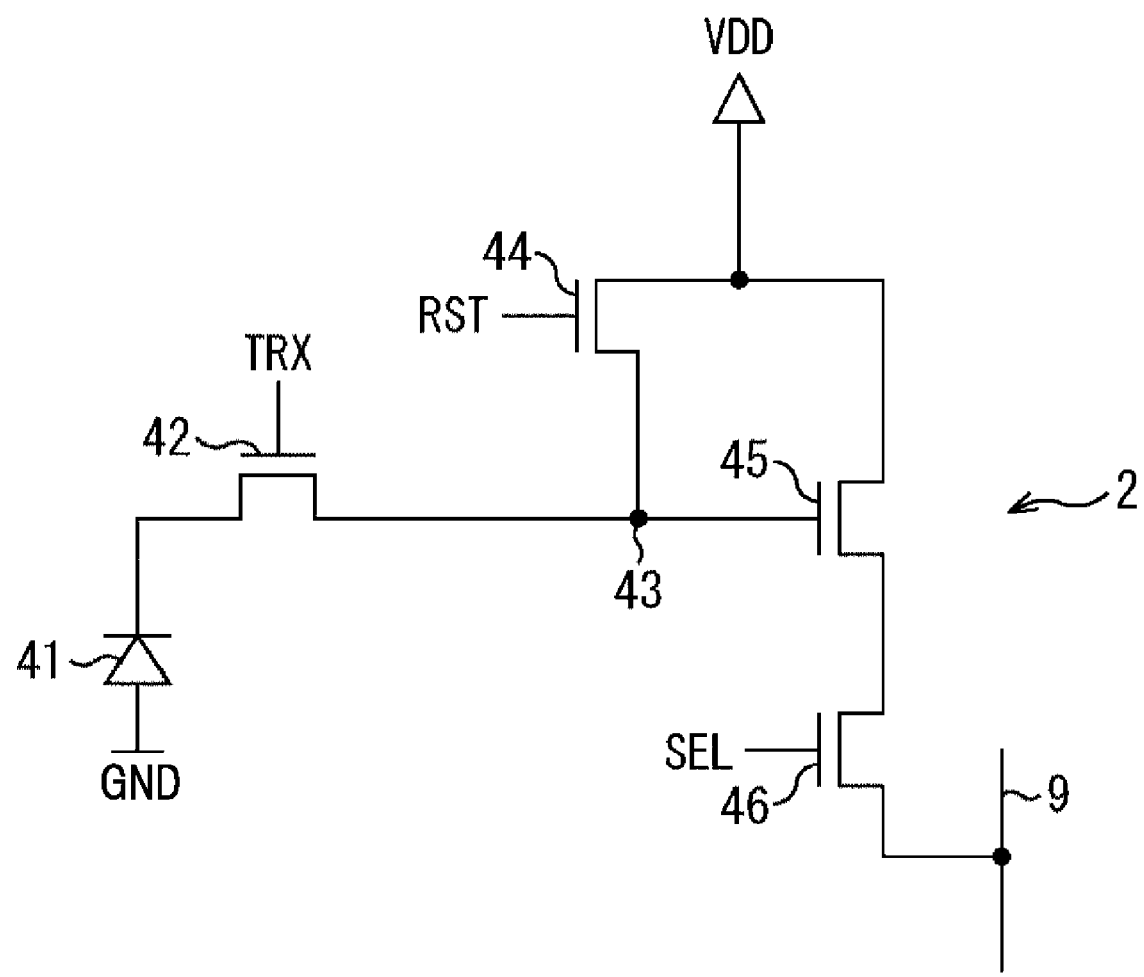
FIG. 2 is a diagram showing a circuit configuration example of pixels.

FIG. 2 shows a circuit configuration example of the pixel 2.

Figure 3:
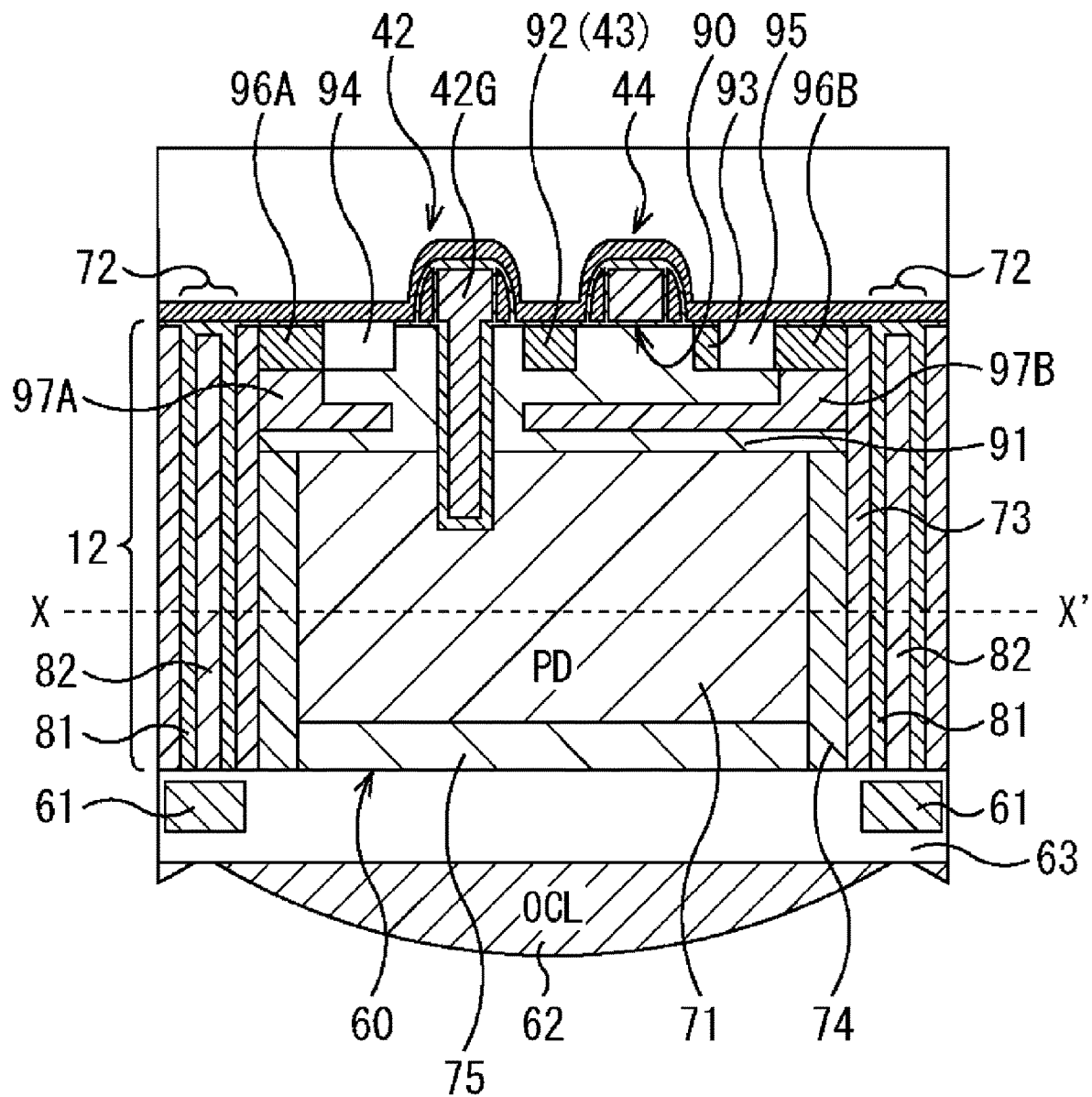
FIG. 3 is a vertical cross-sectional view of a pixel according to a first embodiment.

The pixel 2 includes a PD 41 serving as a photoelectric conversion element, a transfer transistor 42, a floating diffusion (FD) 43, a reset transistor 44, an amplification transistor 45, and a selection transistor 46. As can be seen in FIG. 3, the transfer transistor 42 is at a frontside interface 90 (surface of the substrate 12) and is coupled to the charge storage region 71.

The PD 41 generates and accumulates charges (signal charges) depending on the amount of light received. The PD 41 has an anode terminal grounded and a cathode terminal connected to the FD 43 via the transfer transistor 42.

When turned in accordance with a transfer signal TRX, the transfer transistor 42 reads out charges generated at the PD 41 and transfers them to the FD 43.

The FD 43 retains charges read out from the PD 41. When turned on in accordance with a reset signal RST, the reset transistor 44 resets the potential of the FD 43 in such a manner that charges accumulated in the FD 43 are discharged to a drain (constant-voltage source VDD).

The amplification transistor 45 outputs a pixel signal depending on the potential of the FD 43. That is, the amplification transistor 45 constitutes a load MOS (not shown) and a source follower circuit as a constant-current source connected via the vertical signal lines 9. A pixel signal indicating a level depending on charges accumulated in the FD 43 is output to the column signal processing circuits 5 from the amplification transistor 45 via the selection transistor 46.

When the pixel 2 is selected with a selection signal SEL, the selection transistor 46 is turned on and outputs a pixel signal of the pixel 2 to the column signal processing circuit 5 via the vertical signal line 9. Each signal line to which the transfer signal TRX, the selection signal SEL, and the reset signal RST are transmitted corresponds to the pixel driving wire 10 of FIG. 1.

Although the pixel 2 is configured in the above-mentioned manner, the pixel 2 is not limited to this configuration and other configurations may be employed.

3. Pixel Structure According to First Embodiment

A structure of the pixel 2 of the solid-state imaging apparatus 1 will be described with reference to FIGS. 3 and 4.

FIG. 3 is a vertical cross-sectional view equivalent to one pixel of the solid-state imaging apparatus 1.

Figure 4:
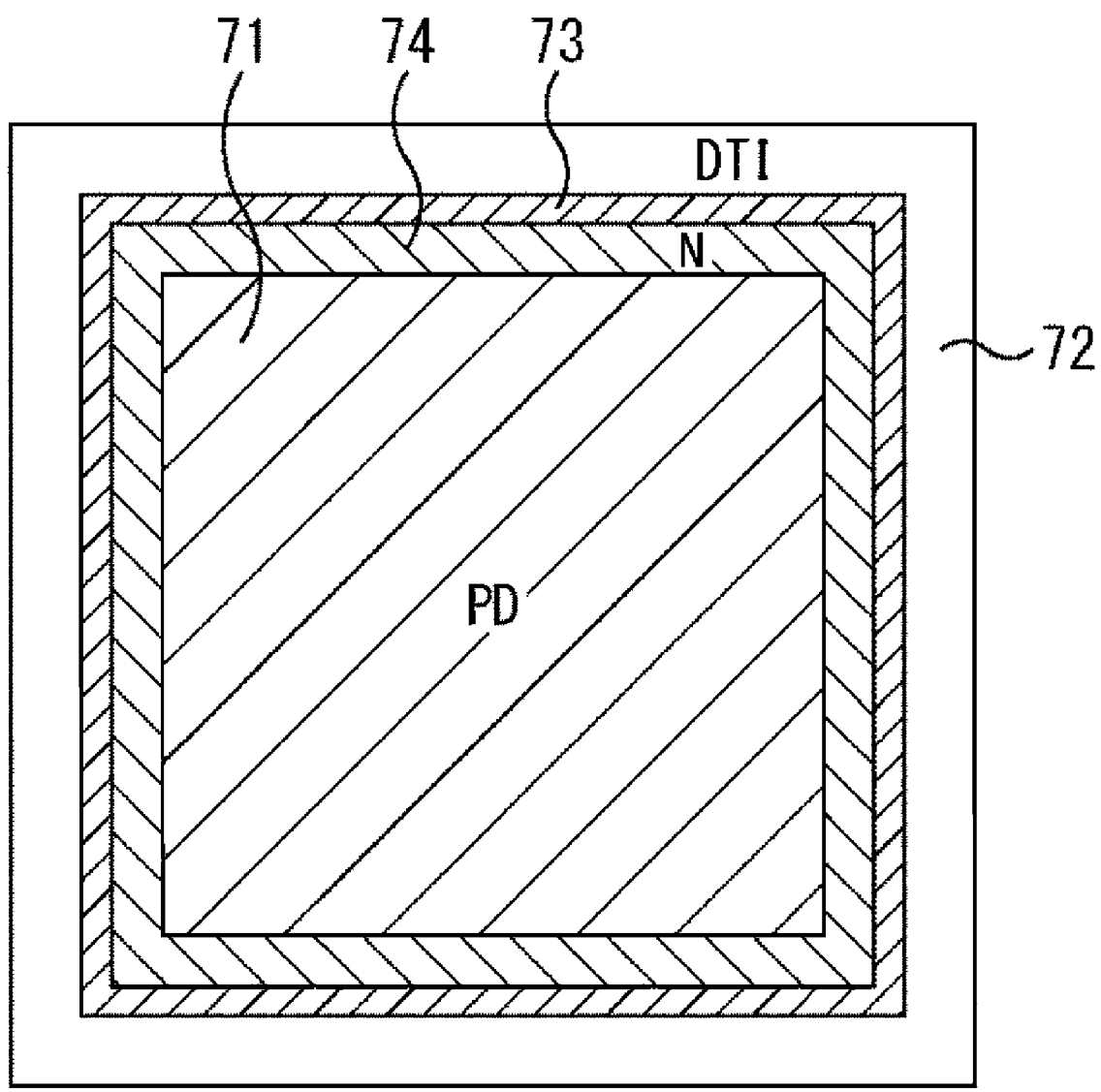
FIG. 4 is a horizontal cross-sectional view of the pixel according to the first embodiment.

FIG. 4 is a horizontal cross-sectional view taken along the X-X' line of FIG. 3.

Note that, hereinafter, descriptions will be made assuming that the semiconductor region of the N-type (first conductivity type) is the N-type layer and the semiconductor region of the P-type (second conductivity type) is the P-type layer.

On a front side of the semiconductor substrate 12, which is an upper side in FIG. 3, the transfer transistor 42, the FD 43, the reset transistor 44, and the like for reading out charges from the PD 41 are formed. Although not shown in FIG. 3, the amplification transistor 45 and the selection transistor 46 are also formed on the front side of the semiconductor substrate 12.

On the other hand, on a back side of the semiconductor substrate 12, which is a lower side in FIG. 3, a light-shielding film 61 and an on-chip lens (OCL) 62 are formed. The light-shielding film 61 suppresses leakage of light to neighboring pixels. The OCL 62 converges incident light to the PD 41. The light-shielding film 61 is, for example, made of metal material such as W (tungsten). The OCL 62 is formed on a flat film 63. As can be seen in FIG. 3, the light-shielding film 61 and the on-chip lens 62 are on a side of a surface (backside surface) of the semiconductor substrate 12 that is different from the frontside surface 90 of the semiconductor substrate 12.

In FIG. 3, no color filters are formed. However, red, green, and blue color filters, for example, may be formed between the OCL 62 and the flat film 63.

Thus, the solid-state imaging apparatus 1 is a backside-illumination MOS solid-state imaging apparatus. In this backside-illumination MOS solid-state imaging apparatus, incident light comes from a backside (on lower side in FIG. 3) opposite to the front side of the semiconductor substrate 12 on which the pixel transistor is formed.

Figure 13:
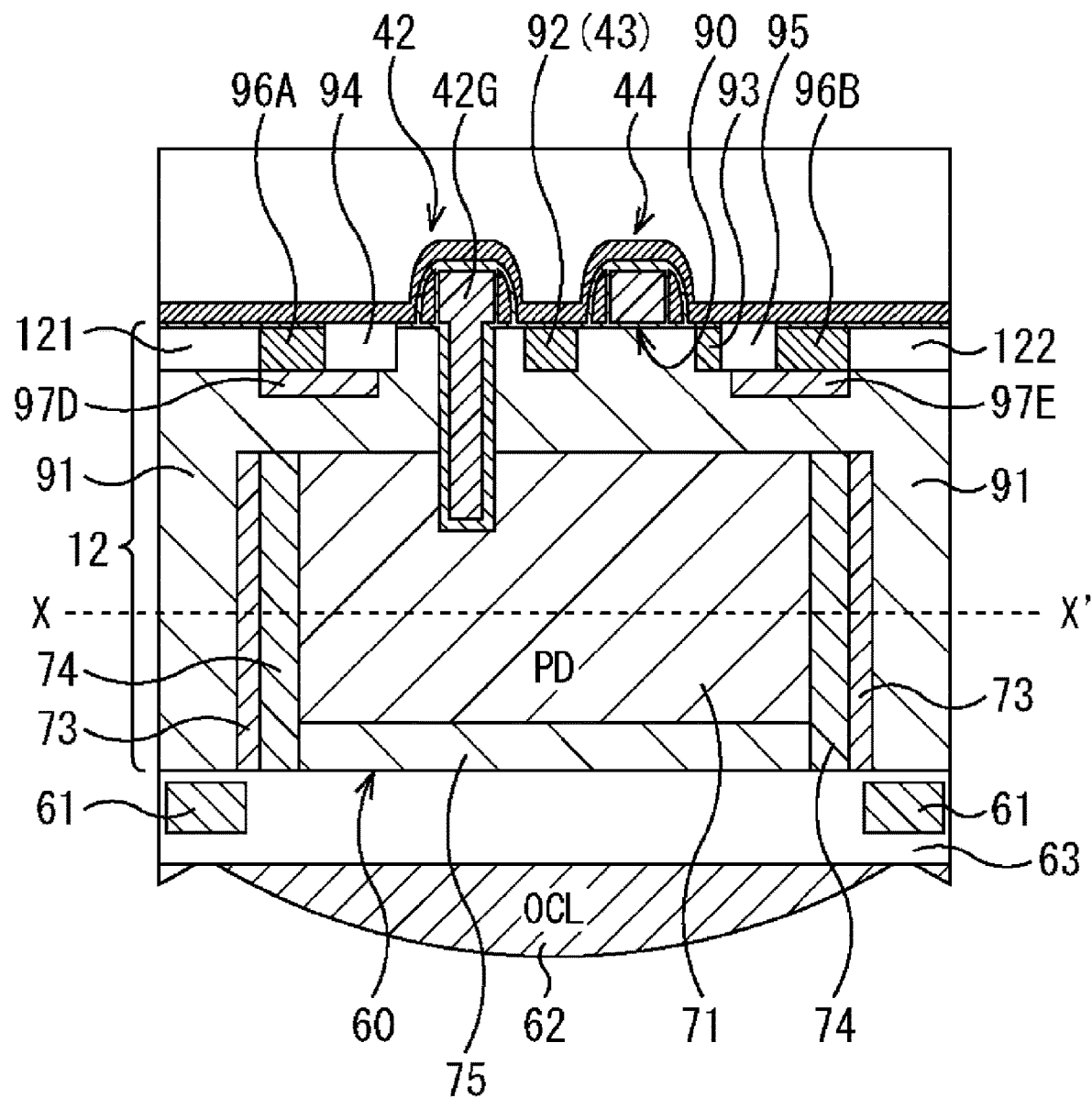
FIG. 13 is a vertical cross-sectional view of a pixel according to a fourth embodiment.

An N-type layer 71 (charge storage region) that constitutes the PD 41 is formed inside the semiconductor substrate 12. As can be seen in FIG. 3, the N-type layer 71 (charge storage region) is at a deeper position in the semiconductor substrate 12 than the frontside interface 90 (substrate interface) of the semiconductor substrate 12. Deep trench isolation (DTI) 72 is formed at pixel boundaries while surrounding the N-type layer 71. The deep trench isolation (DTI) 72 penetrates the semiconductor substrate 12. The DTI 72 is an inter-pixel isolation wall (inter-pixel isolation section) that isolates one pixel from another. The center of (filler 82 of) the DTI 72 becomes a pixel boundary. As can be seen in FIG. 13, the deep trench isolation 72 (inter-pixel isolation section) is configured to penetrate the semiconductor substrate 12 and is arranged in a pixel boundary outside the N-type layer 71 (charge storage region) in a planar view.

The DTI 72 includes a double-layer structure of an outer sidewall film 81 and the filler 82 inside the outer sidewall film 81. The sidewall film 81 can be made of a SiO$_2$ film or SiN film, for example. Polysilicon, doping polysilicon, metal material such as W (tungsten) can be used for the filler 82 to be embedded inside the sidewall film 81. Further, a fixed-charge film having negative fixed charges, such as an HfO film, a TaO film, and an AlO film, may be employed as the sidewall film 81.

A P-type layer 73 and an N-type layer 74 are formed between the N-type layer 71 and the DTI 72, extending along the DTI 72 and held in contact with a backside interface 60 of the semiconductor substrate 12. The P-type layer 73 and the N-type layer 74 are arranged in the stated order from the DTI 72 to the N-type layer 71. With this, a PN junction portion between the P-type layer 73 and the N-type layer 74 forms a strong electric field region and generated charges are retained by the N-type layer 71. The N-type layer 71 is a charge storage region for accumulating charges (electrons) generated in the PD 41. The N-type layer 71 is an example of a charge storage region in the substrate 12 to store charge generated by incident light.

A P-type layer 75 is provided between the backside interface 60 of the semiconductor substrate 12 and the N-type layer 71.

Further, the transfer transistor 42 is formed on the front side of the semiconductor substrate 12. The transfer transistor 42 is a pixel transistor having a trench (longitudinal hole) structure extending into the N-type layer 71 in such a manner that a gate electrode 42G penetrates a P-well region (well region) 91 in a depth direction of the substrate. As can be seen in FIG. 3, the transfer transistor 42 thus has a trench structure in which the gate electrode 42G extends from the frontside interface 90 (substrate surface) to the N-type layer 71 (charge storage region).

An N-type layer 92 arranged in a frontside interface 90 (surface of the substrate) between the transfer transistor 42 and the reset transistor 44 constitutes the FD 43. An N-type diffusion layer 93 formed on the opposite side to the FD 43 of the reset transistor 44 constitutes a drain region of the reset transistor 44. The N-type diffusion layer 93 is an N-type layer having a high concentration.

An shallow trench isolation (STI) 94 is formed on the side opposite to the FD 43 of the transfer transistor 42. The STI 94 is an element isolation region that isolates the pixel transistor formed on the frontside interface 90. An STI 95 that is an element isolation region is also formed outside the N-type diffusion layer 93 that constitutes the drain region of the reset transistor 44. The STIs 94 and 95 are made of insulating material. The insulating material includes an oxide film such as a SiO$_2$ film. The STI 94 and the STI 95 are examples of element isolation regions that isolate the plurality of pixel transistors 42, 44, 45, 46 from each other (see also FIG. 8).

Further, on the front side of the semiconductor substrate 12, an N-type diffusion layer 96A that is the N-type layer having a high concentration is formed in a region adjacent to the STI 94. A positive voltage is applied on the N-type diffusion layer 96A. The N-type diffusion layer 96A is connected to an N-type layer 97A formed below the N-type diffusion layer 96A (in depth direction). The N-type layer 97A is formed extending from below the N-type diffusion layer 96A to below the STI 94 adjacent to the N-type diffusion layer 96A in a horizontal direction. The N-type layer 97A is arranged between the N-type layer 71 that constitutes the PD 41 and the STI 94 via the P-well region 91. Similarly, an N-type diffusion layer 96B that is an N-type layer having a high concentration is formed in a region adjacent to the STI 95. A positive voltage is applied on the N-type diffusion layer 96B. The N-type diffusion layer 96B is connected to an N-type layer 97B formed below the N-type diffusion layer 96B (in depth direction). The N-type layer 97B is formed extending from below the N-type diffusion layer 96B to below the STI 95 adjacent to the N-type diffusion layer 96B and the reset transistor 44 in the horizontal direction. The N-type layer 97B is arranged via the P-well region 91 between the N-type layer 71 that constitutes the PD 41 and the STI 94 and reset transistor 44.

The N-type layer 97A and the N-type layer 97B (charge discharge layers) are of the same conductivity type as the N-type layer 71 (charge storage region). As can be seen in FIG. 3, the N-type layer 97A and the N-type layer 97B (respectively the charge discharge layer) are arranged between the STIs 94 and 95 (element isolation regions) and the N-type layer 71 (charge storage region). The N-type layer 97A and the N-type layer 97B discharge charge from the STIs 94 and, respectively, 95. In particular, the N-type layer 97A and the N-type layer 97B (charge discharge layers) are arranged below the STIs 94 and, respectively, 95 (element isolation regions). It can also be seen in FIG. 3 that the N-type layer 97B (charge discharge layer) is between the N-type layer 71 (charge storage region) and the reset transistor 44. That is, the N-type layer 97B (charge discharge layer) is between the N-type layer 71 (charge storage region) and at least one of the plurality of pixel transistors 44, 45, 46 that is not the transfer transistor 42. Still further, as can be seen in FIG. 3, the N-type layer 97A and the N-type layer 97B (charge discharge layers) include an opening, and the gate electrode 42G of the transfer transistor 42 extends through the opening into the N-type layer 71 (charge storage region). The N-type layer 97A and the N-type layer 97B (charge discharge layers) are coupled to the N-type diffusion layer 96A, respectively to N-type diffusion layer 96B which are examples of impurity regions having a same conductivity type as the N-type layer 71 (charge storage region), wherein the impurity region is at the surface 90 (frontside interface) of the semiconductor substrate 12. The STIs 94 and, respectively, 95 (isolation regions) in the substrate 12 are located adjacent to at least one respective side of the transistors 42, 44. The STIs 94 and, respectively, 95 (isolation regions) are between the N-type diffusion layer 96A, respectively the N-type diffusion layer 96B (impurity regions) and the at transfer one transistor 42, respectively the reset transistor 44.

In the example of FIG. 3, the N-type layer 97B is formed between the reset transistor 44 and the N-type layer 71 that is the charge storage region. However, either the N-type layer 97A or the N-type layer 97B is also arranged below a pixel transistor (amplification transistor 45, selection transistor 46) (not shown) other than the transfer transistor 42 having the trench structure.

4. Actions and Effects of N-Type Layer 97A and N-Type Layer 97B

Next, actions and effects of the N-type layer 97A and the N-type layer 97B will be described.

It is difficult to greatly increase the impurity concentration of the P-type in the P-well region 91 between the pixel transistor formed on the frontside interface 90 of the semiconductor substrate 12 and the N-type layer 71 that is the charge storage region that accumulates charges generated in the PD 41.

The reason why it is difficult to increase the impurity concentration of the P-well region 91 is as follows. That is, if a P-type high-concentration region is formed immediately after the trenches of the STIs 94 and 95 are formed, impurities are diffused due to heat treatment after element insulation. On the contrary, if P-type ion implantation is performed after heat treatment of the STIs 94 and 95, it is difficult to obtain a locally high-concentration state due to the spread upon ion implantation because of its high implantation energy. If a high-concentration P-type layer is formed at the bottoms of the STIs 94 and 95, the electric field of the source region or drain region of the pixel transistor with the N-type layer becomes stronger, and leak current increases. Therefore, it is difficult to increase the impurity concentration of the P-well region 91.

Figure 5:
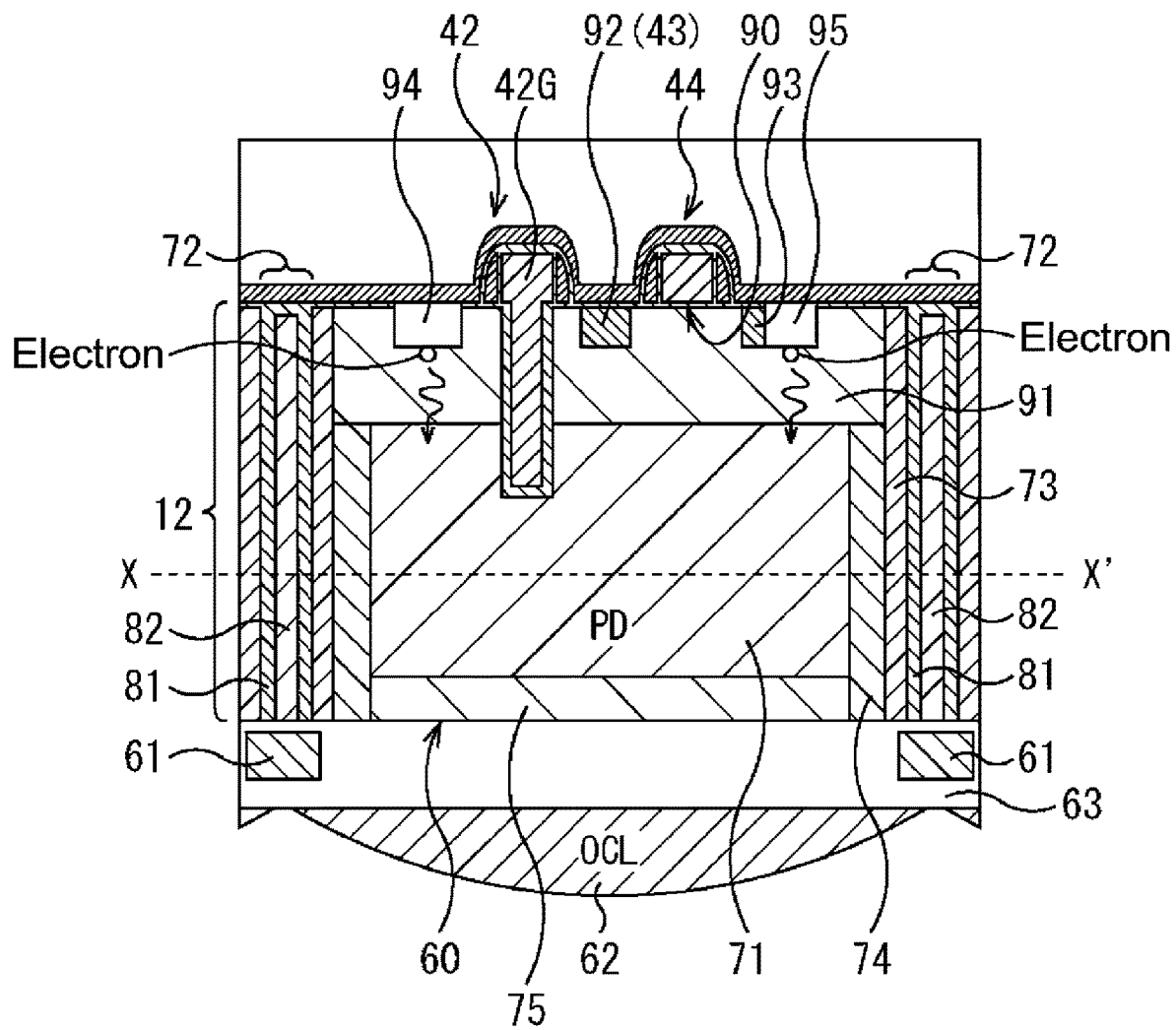
FIG. 5 is a diagram describing actions and effects of a pixel structure according to the first embodiment.

If the N-type layer 97A and the N-type layer 97B are not formed within the P-well region 91 as shown in FIG. 5, electrons generated in the bottom surfaces of the STIs 94 and 95 flow into the N-type layer 71 that is the charge storage region. As a result, dark current increases.

Figure 6:
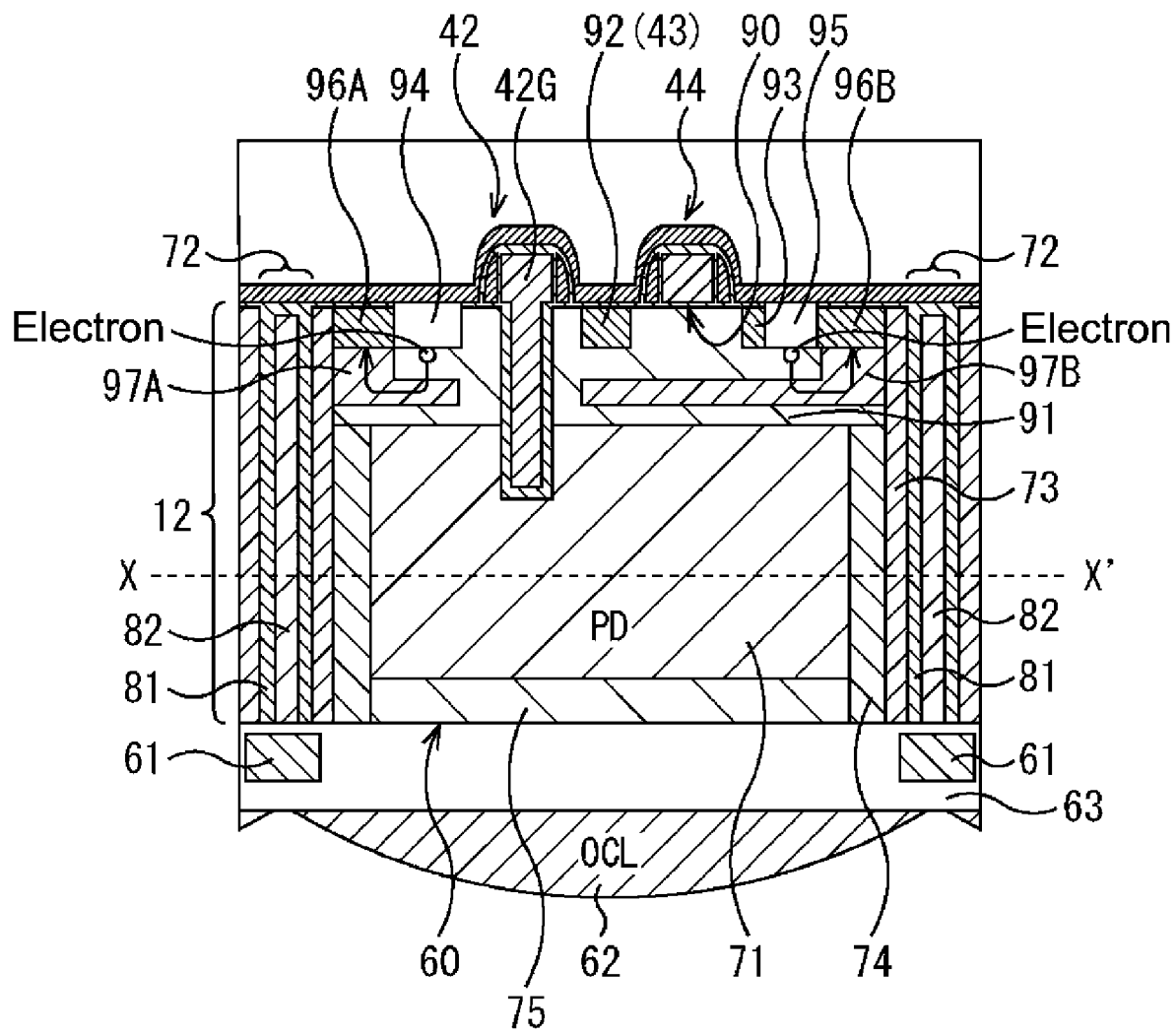
FIG. 6 is a diagram describing actions and effects of the pixel structure according to the first embodiment.

In contrast, as in the pixel 2 of the solid-state imaging apparatus 1, by forming the N-type layer 97A and the N-type layer 97B within the P-well region 91 between the pixel transistor such as the reset transistor 44 and the N-type layer 71 that is the charge storage region, electrons generated at the bottoms of the STIs 94 and 95 as shown in FIG. 6 can be discharged from the N-type layer 97A and the N-type layer 97B to the N-type diffusion layers 96A and 96B on which a positive voltage is applied. Therefore, it is possible to prevent (or alternatively, reduce) electrons from flowing into the N-type layer 71 that is the charge storage region.

Therefore, the N-type layer 97A and the N-type layer 97B of the same conductivity type (N-type) as the charge storage region within the P-well region 91 is provided between the pixel transistor and the N-type layer 71 that is the charge storage region. In this manner, dark current generated at the bottoms of the STIs 94 and 95 that isolate the elements of the pixel transistor can be suppressed. In particular, the N-type diffusion layers 96A and 96B (impurity regions) may have a higher impurity concentration than the N-type layer 97A and the N-type layer 97B (charge discharge layers).

Note that, although a configuration in which two N-type diffusion layers 96 and two N-type layers 97 for discharging electrons generated at the bottoms of the STIs 94 and 95 are provided within the pixel 2 as the N-type diffusion layers 96A and 96B and the N-type layers 97A and 97B is employed in the above-mentioned example, a single region may form them.

5. Pixel Plan View

Figure 7:
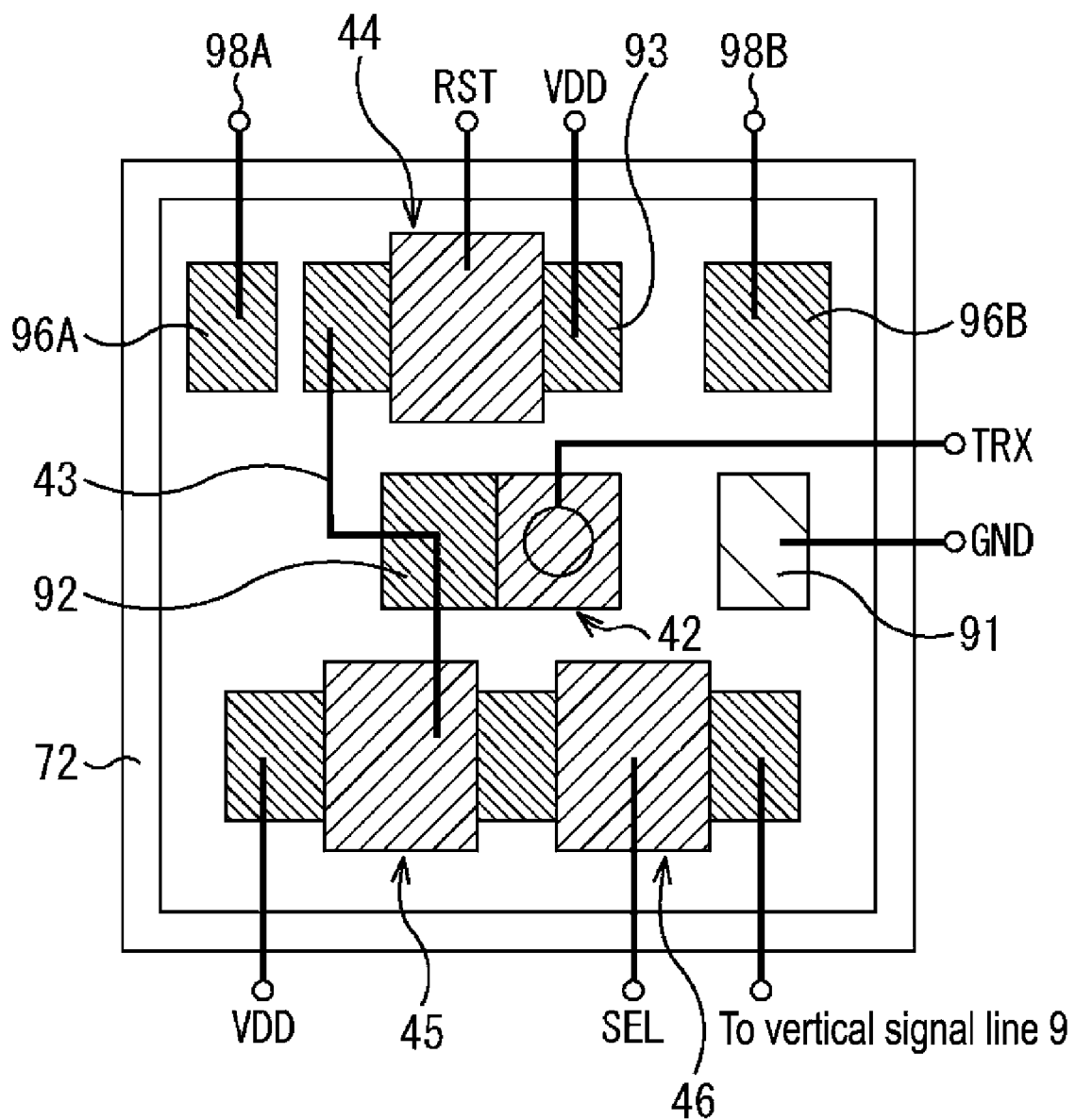
FIG. 7 is a plan view of the pixel.

FIG. 7 is a plan view of the pixel 2 of the front side of the semiconductor substrate 12 on which the pixel transistor is formed.

Portions of FIG. 7 which correspond to those of FIG. 3 are denoted by identical symbols, and descriptions thereof will be appropriately omitted.

The N-type diffusion layers 96A and 96B that discharge electrons generated at the bottoms of the STIs 94 and 95 are independently provided separately from the source region 92 and the drain region 93 of the pixel transistor as shown in FIG. 7. The N-type diffusion layers 96A and 96B are thus examples for an impurity region that is separate from a source region 92 and a drain region 93 of a pixel transistor.

A positive voltage is applied on the N-type diffusion layer 96A from a drain terminal 98A. A positive voltage is applied on the N-type diffusion layer 96B from a drain terminal 98B. The P-well region 91 is connected to the ground (GND).

Note that a voltage to be applied on the drain terminals 98A and 98B only needs to be a higher voltage than the potential of the P-well region 91 and may be the constant-voltage source VDD.

Other Configuration Examples

As shown in FIG. 7, the N-type diffusion layer 96 (96A and 96B) serving as a portion to which electrons of dark current components are to be discharged may be provided independently from the source region or the drain region of the pixel transistor. However, the N-type diffusion layer 96 (96A and 96B) may be shared with the drain region of the pixel transistor.

Figure 8:
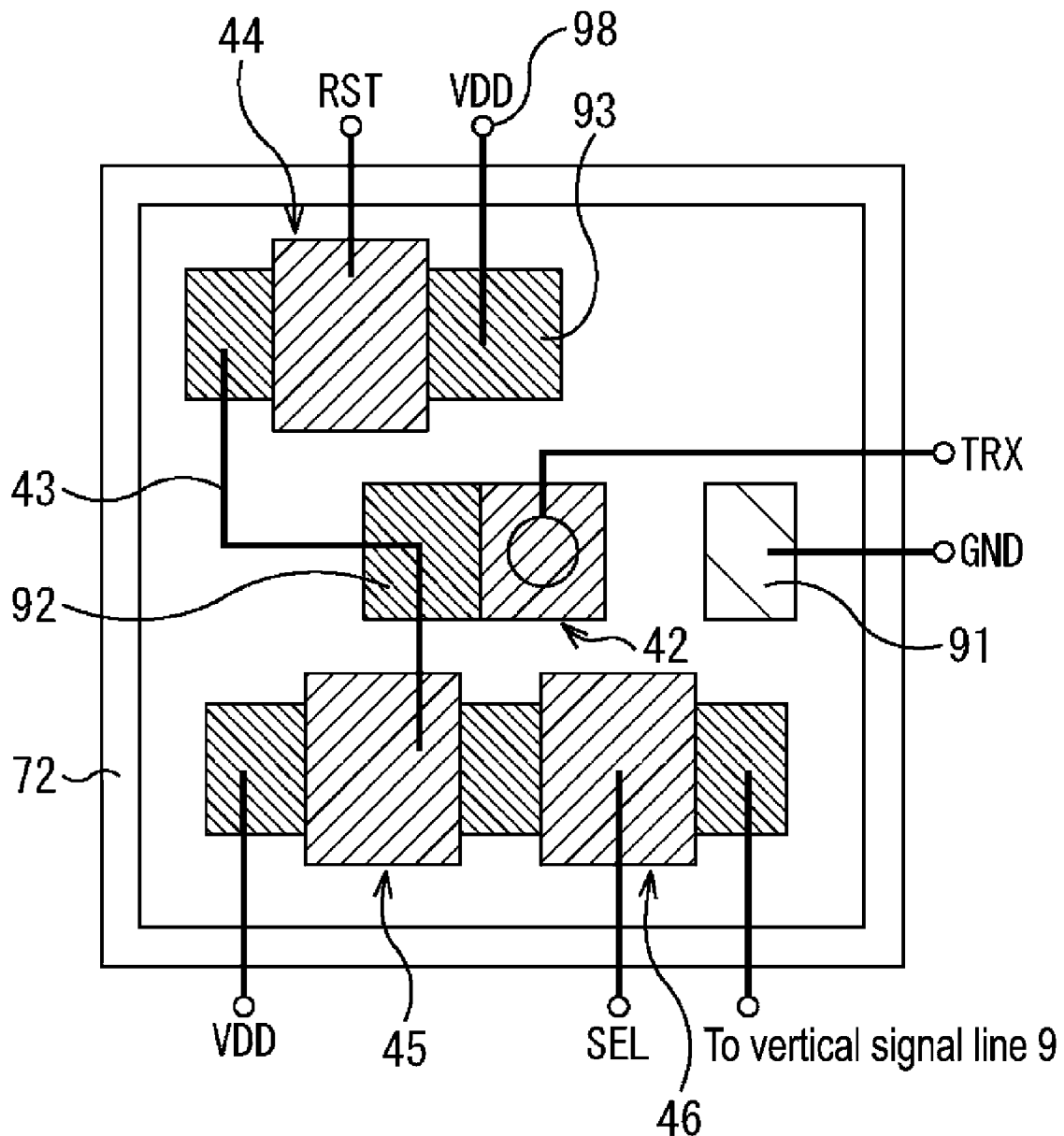
FIG. 8 is a plan view showing another configuration example of the pixel.

For example, as shown in FIG. 8, the N-type diffusion layer 96 serving as the portion to which electrons of dark current components are to be discharged may be shared with the N-type diffusion layer 93 that is the drain region of the reset transistor 44. The terminal that applies the constant-voltage source VDD (predetermined voltage) on the N-type diffusion layer 93 that functions as the N-type diffusion layer 96 also serves as a drain terminal 98 in FIG. 7. The drain region 93 of the reset transistor 44 is thus an example of an impurity region that is coupled to the N-type layer 97B (charge discharge layer) having a same conductivity type as the charge storage region.

Figure 9:
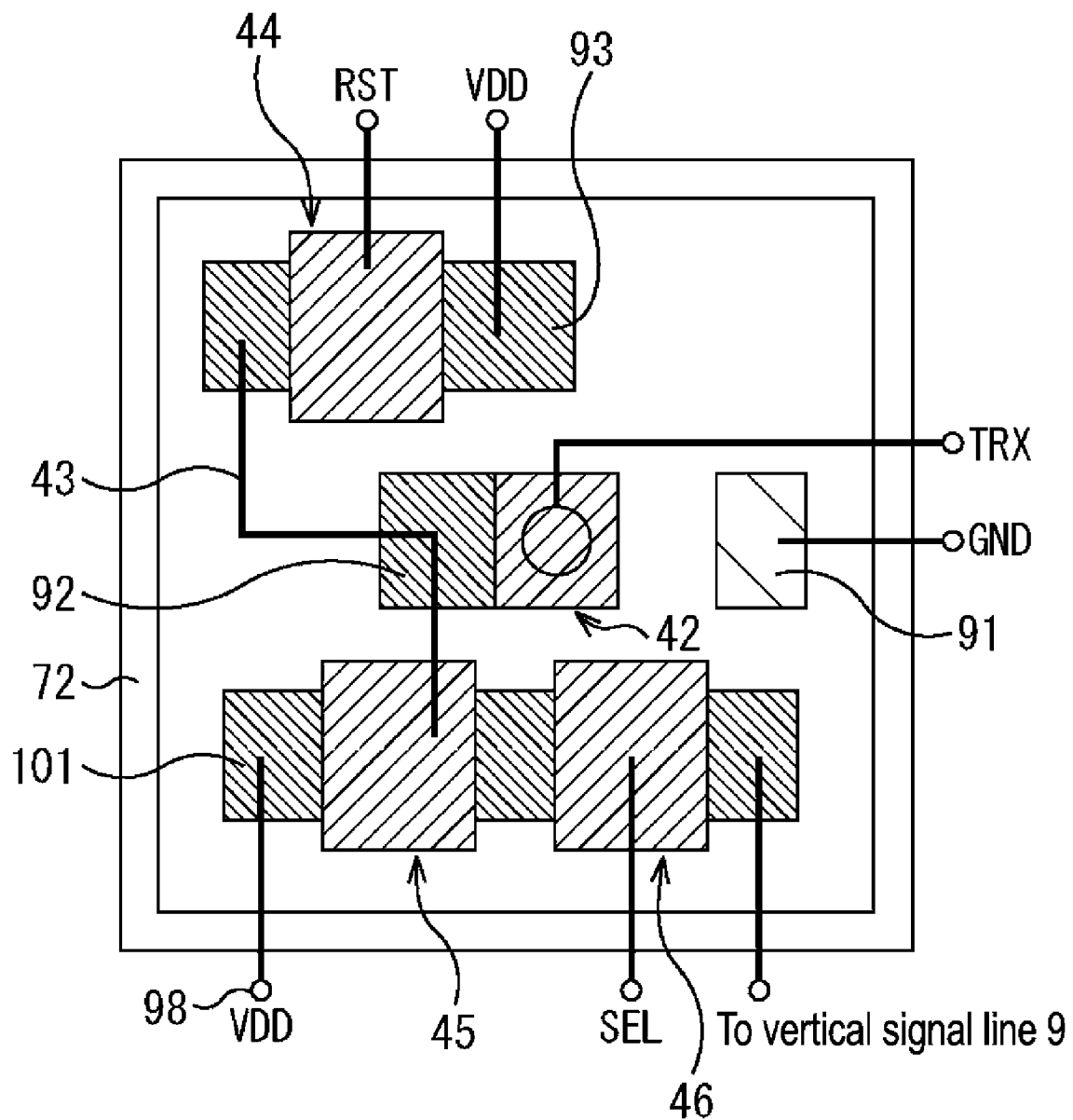
FIG. 9 is a plan view showing another configuration example of the pixel.

Further, for example, as shown in FIG. 9, the N-type diffusion layer 96 serving as the portion to which electrons of dark current components are to be discharged may be shared with an N-type diffusion layer 101 that is the drain region of the amplification transistor 45. The terminal that applies the constant-voltage source VDD on the N-type diffusion layer 101 that functions as the N-type diffusion layer 96 also serves as the drain terminal 98 in FIG. 7. The drain region 101 of the amplification transistor 45 is thus an example of an impurity region that is coupled to a charge discharge layer having a same conductivity type as the charge storage region.

Figure 10:
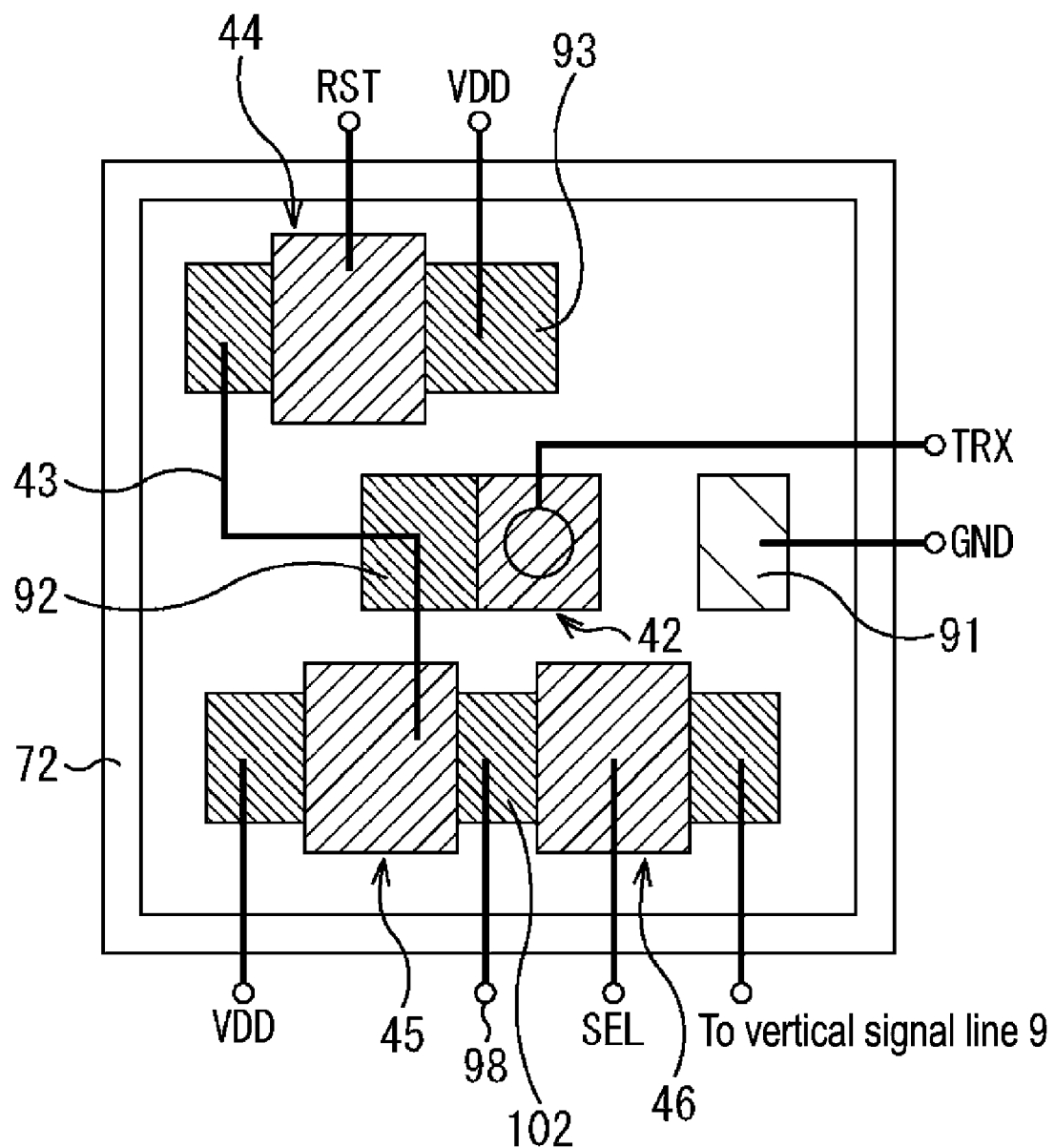
FIG. 10 is a plan view showing another configuration example of the pixel.

In the examples of FIGS. 8 and 9, the function of the N-type diffusion layer 96 is shared with the diffusion layer on which a fixed potential (VDD) is constantly applied. However, the function of the N-type diffusion layer 96 may be shared with the semiconductor region whose potential changes. For example, the N-type diffusion layer 96 serving as the portion to which electrons of dark current components are to be discharged may be shared with an N-type layer 102 between the amplification transistor 45 and the selection transistor 46 as shown in FIG. 10. Regarding this N-type layer 102, the reset transistor 44 is constantly on and the constant-voltage source VDD is applied on the amplification transistor 45 during accumulation of charges. Therefore, due to the provision of the drain terminal 98, electrons of dark current components can be discharged. Although the potential of the N-type layer 102 changes when pixel signals are read out (charges are read out), dark current in a read-out period is not problematic. Therefore, the N-type layer 102 can be used as the N-type layer that discharges electrons of dark current components. The N-type diffusion layer 96 N-type layer 102 between the amplification transistor 45 and the selection transistor 46 is thus an example of an impurity region that is coupled to a charge discharge layer having a same conductivity type as the charge storage region.

6. Pixel Structure According to Second Embodiment

Figure 11:
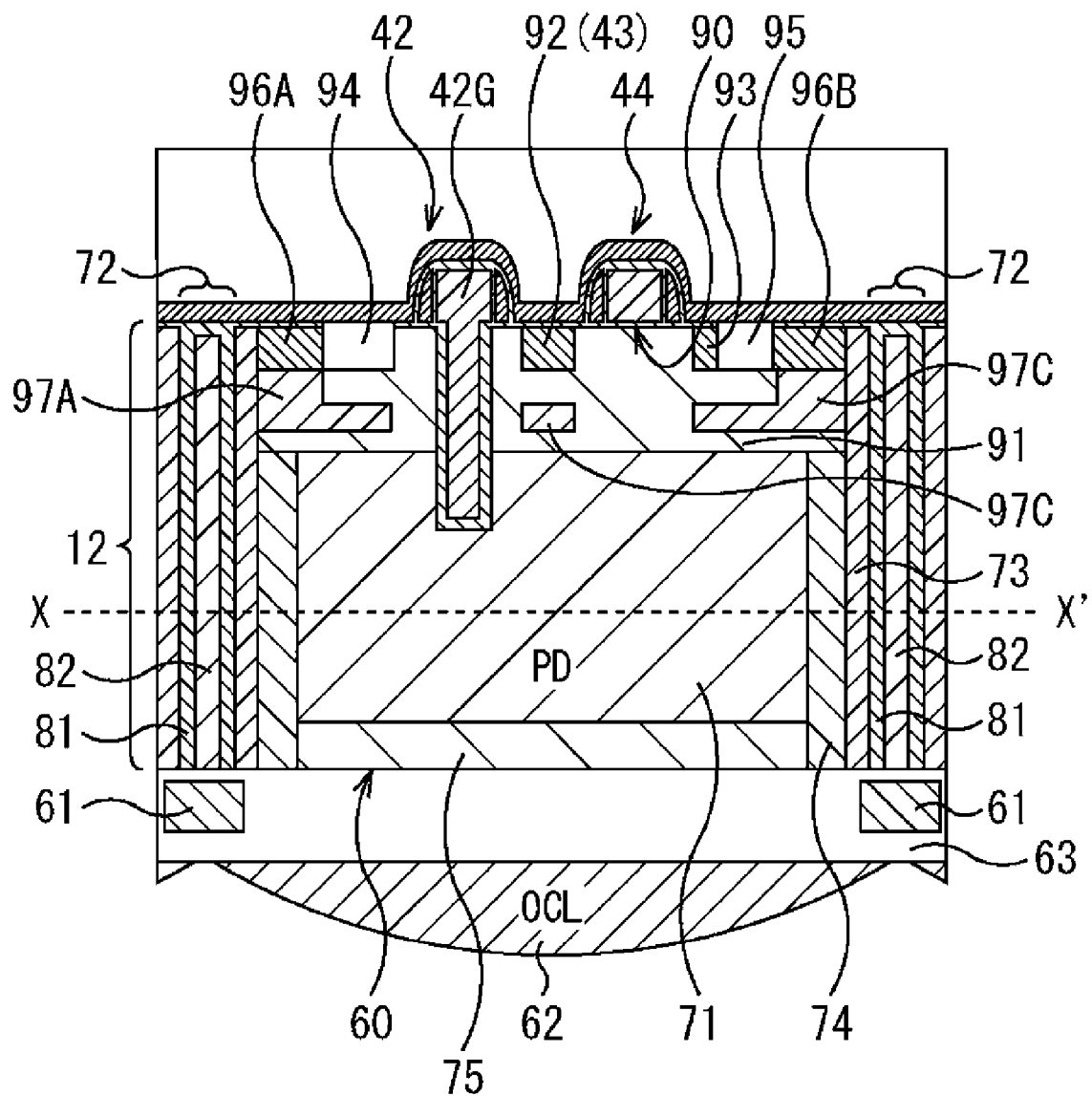
FIG. 11 is a vertical cross-sectional view of a pixel according to a second embodiment.

FIG. 11 is a vertical cross-sectional view showing a pixel structure as a second embodiment of the pixel 2.

FIG. 11 corresponds to the vertical cross-sectional view of FIG. 3 as the first embodiment. Portions of FIG. 11 which correspond to those of FIG. 3 are denoted by identical symbols. Therefore, descriptions thereof will be omitted.

In the second embodiment shown in FIG. 11, the N-type layer 97B formed within the P-well region 91 in FIG. 3 is replaced by an N-type layer 97C. Other configurations are similar to those of the first embodiment.

In the first embodiment, the N-type layer 97 (97A or 97B) is formed below the pixel transistor other than the transfer transistor 42 having the trench structure. Dividing the P-well region 91 into upper and lower parts in the entire pixel as in the first embodiment has a high effect of suppressing inflow of electrons. However, it may increase the resistance of the P-well region 91 and make the potential fixation instable. In particular, the instable well potential of the pixel transistor leads to operation noise, and hence it is desirable to avoid it.

In view of this, in the second embodiment shown in FIG. 11, the N-type layer 97C is not provided below the gate electrode of the pixel transistor other than the transfer transistor 42. With this, the potential fixation of the P-well region 91 directly below the pixel transistor can be strengthened. Dark current generated at the bottoms of the STIs 94 and 95 can be reduced while avoiding the instability of operations.

7. Pixel Structure According to Third Embodiment

Figure 12:
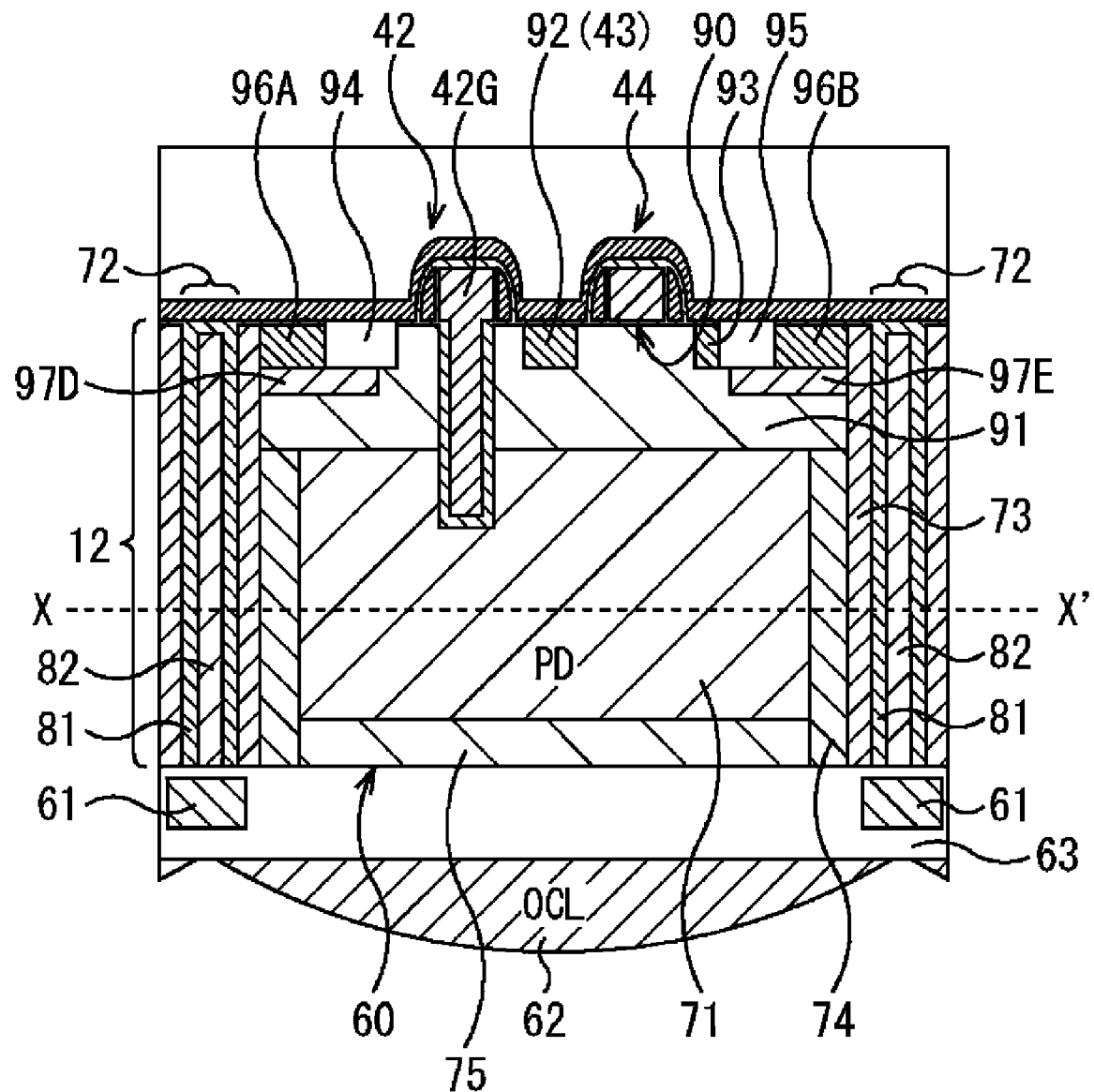
FIG. 12 is a vertical cross-sectional view of a pixel according to a third embodiment.

FIG. 12 is a vertical cross-sectional view showing a pixel structure as a third embodiment of the pixel 2.

Also in FIG. 12, portions corresponding to those of the above-mentioned first and second embodiments are denoted by identical symbols, and descriptions thereof will be omitted.

In the third embodiment shown in FIG. 12, the N-type layers 97A and 97B formed within the P-well region 91 in FIG. 3 are replaced by N-type layers 97D and 97E. Other configurations are similar to those of the first embodiment.

In the first embodiment of FIG. 3, a laminate structure of the P-well region 91, the N-type layer 97A or 97B, and the P-well region 91 is provided between the STIs 94 and 95 and the N-type layer 71 that is the charge storage region. Therefore, a distance (thickness) from the frontside interface 90 of the semiconductor substrate 12 to the N-type layer 71 that is the charge storage region increases. As a result, the length of a path for reading out charges from the N-type layer 71 that is the charge storage region increases. Therefore, there is a fear that transferring charges may be deteriorated.

In contrast, in the third embodiment of FIG. 12, the N-type layers 97D and 97E are arranged directly below the STIs 94 and 95 so as to be connected to the bottom surfaces of the STIs 94 and 95, respectively. In other words, the P-well region 91 between the STI 94 or 95 and the N-type layer 97A or 97B in the first embodiment is omitted. With this, the distance (thickness) from the frontside interface 90 of the semiconductor substrate 12 to the N-type layer 71 that is the charge storage region can be shortened. Therefore, the deterioration of transferring charges can be alleviated.

It is difficult to arrange the N-type layers 97D and 97E in end portions of the bottoms of the STI 94 and 95, which are closer to neighboring pixel transistors, due to electrical separation. Meanwhile, the bottoms of other large parts of the STI 94 and 95 can be covered with the N-type layers. Thus, it is possible to prevent (or alternatively, reduce) electrons of dark current components generated in this region from flowing into the PD.

8. Pixel Structure According to Fourth Embodiment

FIG. 13 is a vertical cross-sectional view showing a pixel structure as a fourth embodiment of the pixel 2.

Also in FIG. 13, portions corresponding to those of the above-mentioned first to third embodiments are denoted by identical symbols, and descriptions thereof will be omitted.

In the fourth embodiment shown in FIG. 13, configurations of the N-type layers that reduce dark current generated at the bottoms of the STIs 94 and 95 are similar to those of the third embodiment shown in FIG. 12. That is, in the fourth embodiment, the N-type layers 97D and 97E are arranged directly below the STIs 94 and 95 so as to be connected to the bottom surfaces of the STIs 94 and 95, respectively.

On the other hand, the point that the fourth embodiment of FIG. 13 is different from the third embodiment of FIG. 12 and that the DTI 72 provided at the outer peripheral portion of the pixel 2 is replaced by STIs 121 and 122 of the frontside interface 90 and the P-well region 91.

A plan view of the pixel 2 of the front side of the semiconductor substrate 12 can be employed in any configurations of FIGS. 7 to 10. It should be noted that the DTI 72 provided in an outer peripheral portion in FIGS. 7 to 10 is omitted.

As can be seen, the configurations of the N-type layers that reduce dark current generated at the bottoms of the STIs 94 and 95 are not limited to the pixel structure including the DTI 72 at the pixel boundaries.

Note that, although the example employing the configuration of the third embodiment shown in FIG. 12 as the configurations of the N-type layers that reduce dark current generated at the bottoms of the STIs 94 and 95 have been described in the example of FIG. 13, any configurations of the first embodiment shown in FIG. 3 and the second embodiment shown in FIG. 11 can be employed.

9. Conclusions

The pixel 2 according to each of the above-mentioned first to fourth embodiments has the pixel structure in which the N-type layer 71, the P-type layer 73, and the N-type layer 74 that constitute the PD 41 are not arranged in the frontside interface 90 of the semiconductor substrate 12 in which the pixel transistor is formed and are arranged at positions deeper than the frontside interface 90. Then, the PN junction area can be increased by forming the PN junction portion between the P-type layer 73 and the N-type layer 74 that are a PN junction surface of the PD 41 in a side surface of the substrate in the depth direction. Therefore, the amount of charge handled can be increased. Charges accumulated in the N-type layer 71 are transferred to the FD 43 formed on the frontside interface 90 by the transfer transistor 42 having the trench structure.

Within the P-well region 91 between the STIs 94 and 95 formed on the frontside interface 90 of the semiconductor substrate 12 in which the pixel transistors such as the reset transistor 44 are arranged and the N-type layer 71 that is the charge storage region, the N-type layer 97 (N-type layers 97A to 97E) of the same conductivity type as the charge storage region is provided as a charge discharge layer. The N-type layer 97 is connected to the N-type diffusion layer 96 (96A, 96B) formed on the frontside interface 90. With this, dark current generated at the bottoms of the STIs 94 and 95 can be discharged into the N-type diffusion layer 96. Therefore, dark current generated at the bottoms of the STIs 94 and 95 can be reduced.

Thus, with the pixel 2 according to the first to fourth embodiments, inflow of electrons of dark current components generated at the bottoms of the STIs 94 and 95 into the N-type layer 71 that is the charge storage region of the PD 41 can be suppressed while increasing the amount of charge handled of the PD 41. That is, a solid-state imaging apparatus including pixels excellent in dark characteristics and having a large amount of charge handled can be provided.

10. Configuration Example of Stacked-Type Solid-State Imaging Apparatus to which Technology According to Present Disclosure can be Applied The pixel structure according to each of the above-mentioned embodiments can also be applied to a solid-state imaging apparatus formed by stacking a plurality of substrates as described below, for example.

Figure 14:
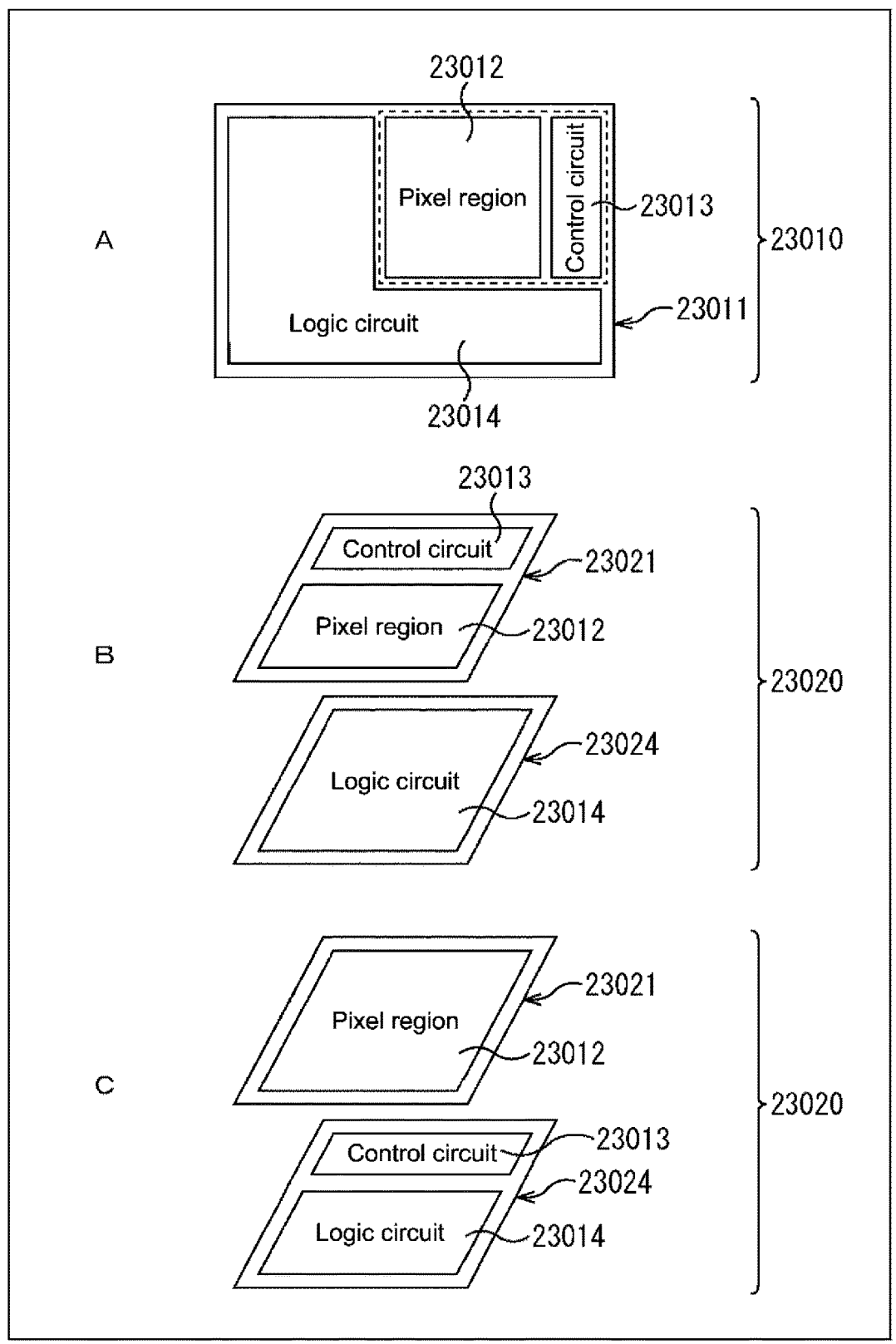
FIG. 14 is a diagram showing the outline of a configuration example of a stacked-type solid-state imaging apparatus to which the technology according to the present disclosure can be applied.

FIG. 14 is a diagram showing the outline of a configuration example of the stacked-type solid-state imaging apparatus to which the technology according to the present disclosure can be applied.

A of FIG. 14 shows a schematic configuration example of a non-stacked-type solid-state imaging apparatus. As shown in A of FIG. 14, a solid-state imaging apparatus 23010 includes a single die (semiconductor substrate) 23011. This die 23011 installs a pixel region 23012 in which pixels are arranged in an array, a control circuit 23013 that controls driving of the pixels and performs other various controls, and a logic circuit 23014 for signal processing.

B and C of FIG. 14 show a schematic configuration example of the stacked-type solid-state imaging apparatus. As shown in B and C of FIG. 14, two dies of a sensor die 23021 and a logic die 23024 are stacked and electrically connected to each other. In this manner, the solid-state imaging apparatus 23020 is configured as a single semiconductor chip.

In B of FIG. 14, the sensor die 23021 installs the pixel region 23012 and the control circuit 23013. The logic die 23024 installs the logic circuit 23014 including a signal processing circuit that performs signal processing.

In C of FIG. 14, the sensor die 23021 installs the pixel region 23012. The logic die 23024 installs the control circuit 23013 and the logic circuit 23014.

Figure 15:
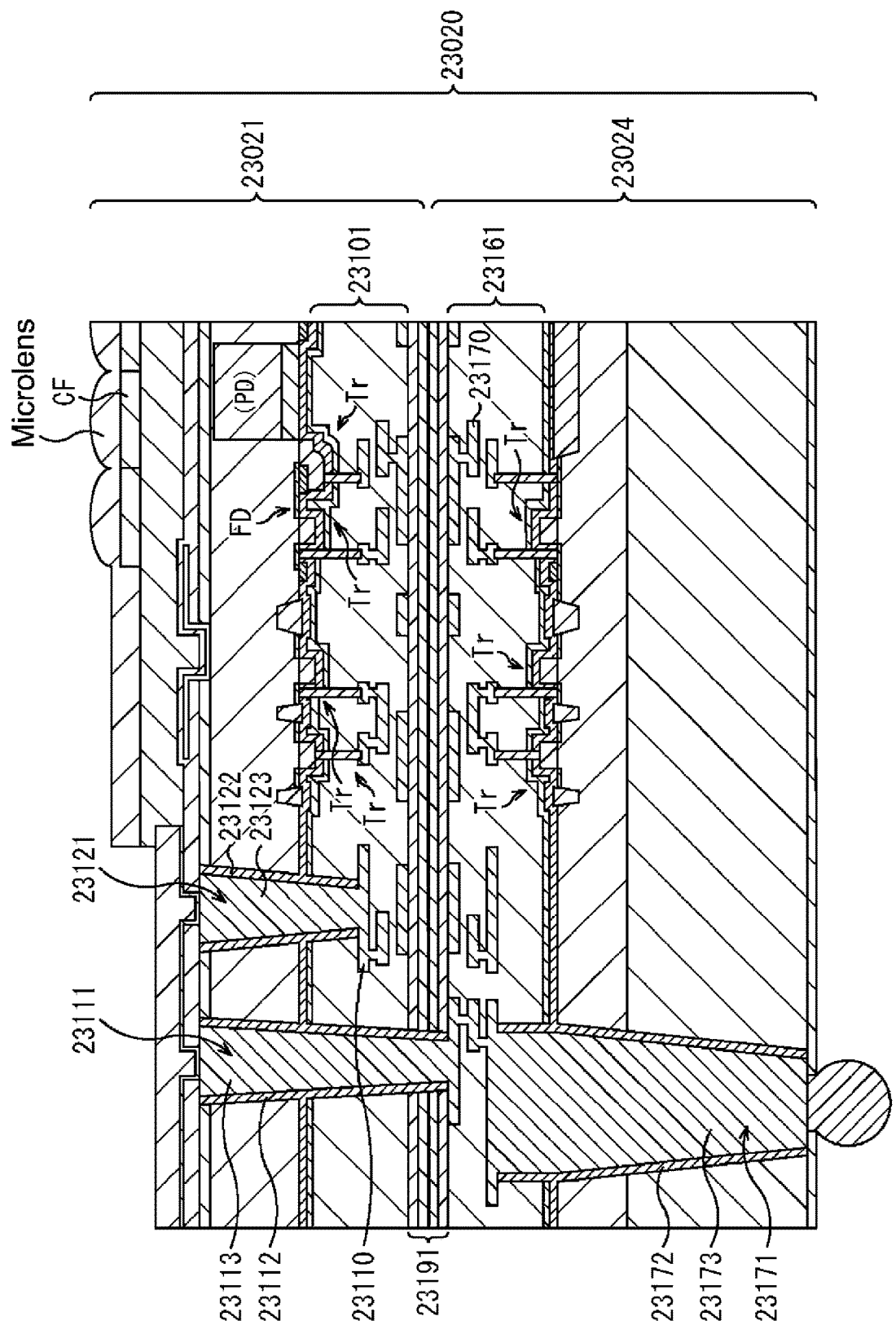
FIG. 15 is a cross-sectional view showing a first configuration example of a stacked-type solid-state imaging apparatus 23020.

FIG. 15 is a cross-sectional view showing a first configuration example of the stacked-type solid-state imaging apparatus 23020.

In the sensor die 23021, a photodiode (PD), a floating diffusion (FD), and transistors (Tr) (MOS FET), which constitute a pixel that becomes the pixel region 23012, and Tr and the like, which become the control circuit 23013, are formed. In addition, a wiring layer 23101 is formed in the sensor die 23021. The wiring layer 23101 includes a plurality of layers, in this example, three-layer wires 23110. Note that (Tr that becomes) the control circuit 23013 can be formed in not the sensor die 23021 but the logic die 23024.

Tr constituting the logic circuit 23014 is formed in the logic die 23024. In addition, a wiring layer 23161 is formed in the logic die 23024. The wiring layer 23161 includes a plurality of layers, in this example, three-layer wires 23170. Further, a connection hole 23171 is formed in the logic die 23024. The connection hole 23171 has an insulation film 23172 formed on an inner wall surface thereof. A connection conductor 23173 to be connected to the wire 23170 and the like is embedded in the connection hole 23171.

The sensor die 23021 and the logic die 23024 are bonded to each other such that the wiring layers 23101 and 23161 thereof face each other. With this, the stacked-type solid-state imaging apparatus 23020 in which the sensor die 23021 and the logic die 23024 are stacked is formed. A film 23191 such as a protection film is formed in a face on which the sensor die 23021 and the logic die 23024 are bonded to each other.

A connection hole 23111 is formed in the sensor die 23021. The connection hole 23111 penetrates the sensor die 23021 from the backside (side on which light enters the PD) (upper side) of the sensor die 23021 and reaches an uppermost layer wire 23170 of the logic die 23024. In addition, a connection hole 23121 is formed in the sensor die 23021. The connection hole 23121 is located in proximity of the connection hole 23111 and reaches a first-layer wire 23110 from the backside of the sensor die 23021. An insulation film 23112 is formed on an inner wall surface of the connection hole 23111. An insulation film 23122 is formed on an inner wall surface of the connection hole 23121. Then, connection conductors 23113 and 23123 are embedded in the connection holes 23111 and 23121, respectively. The connection conductor 23113 and the connection conductor 23123 electrically connected to each other on the back side of the sensor die 23021. With this, the sensor die 23021 and the logic die 23024 are electrically connected to each other via the wiring layer 23101, the connection hole 23121, the connection hole 23111, and the wiring layer 23161.

Figure 16:
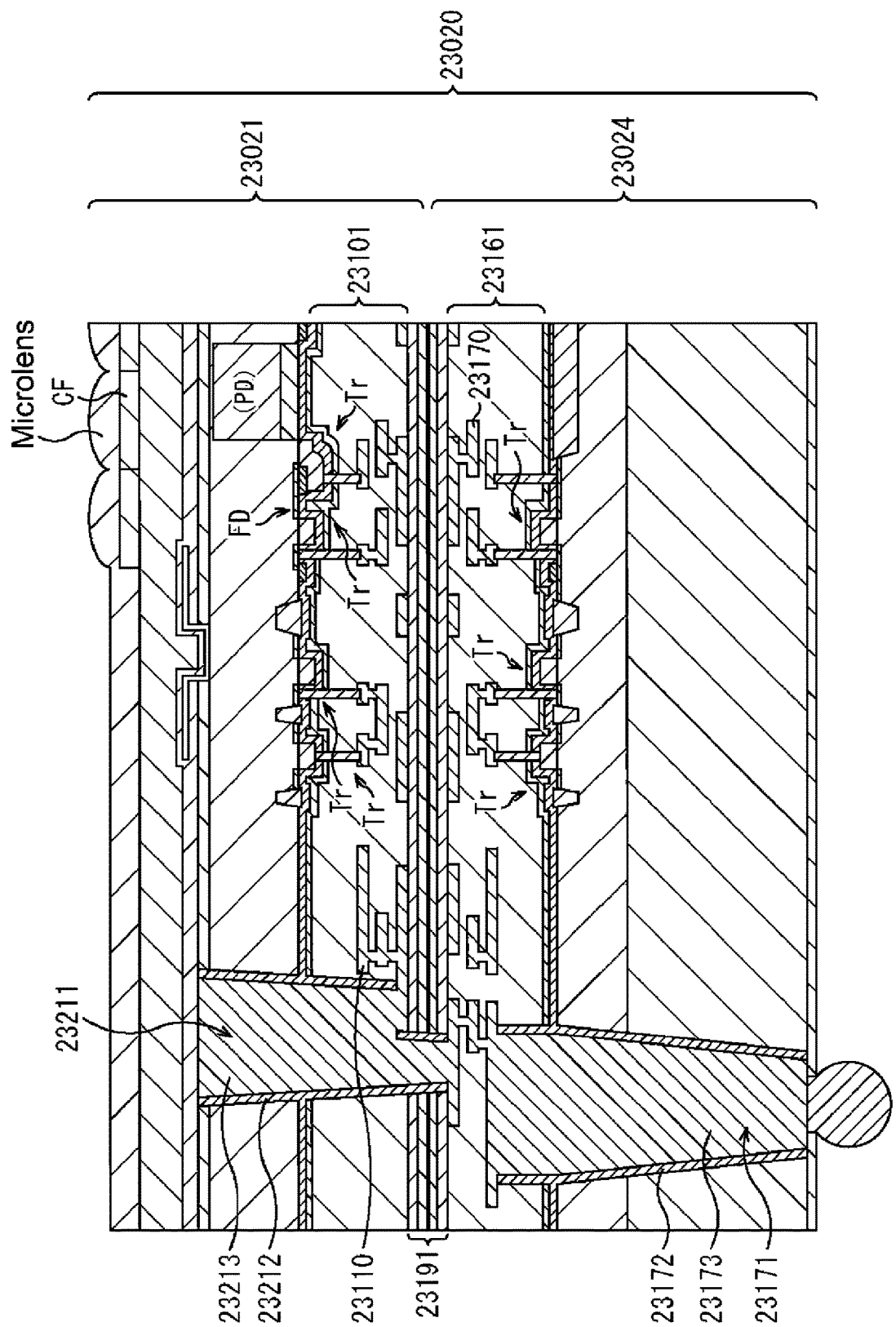
FIG. 16 is a cross-sectional view showing a second configuration example of the stacked-type solid-state imaging apparatus 23020.

FIG. 16 is a cross-sectional view showing a second configuration example of the stacked-type solid-state imaging apparatus 23020.

In a second configuration example of the solid-state imaging apparatus 23020, ((the wire 23110 of) the wiring layer 23101 of) the sensor die 23021 and ((the wire 23170 of) the wiring layer 23161 of) the logic die 23024 are electrically connected to each other through a single connection hole 23211 formed in the sensor die 23021.

That is, in FIG. 16, the connection hole 23211 is formed penetrating the sensor die 23021 from the back side of the sensor die 23021 and reaching an uppermost layer wire 23170 of the logic die 23024 and an uppermost layer wire 23110 of the sensor die 23021. An insulation film 23212 is formed on the inner wall surface of the connection hole 23211. A connection conductor 23213 is embedded in the connection hole 23211. In FIG. 15 described above, the sensor die 23021 and the logic die 23024 are electrically connected to each other through the two connection holes 23111 and 23121. On the other hand, in FIG. 16, the sensor die 23021 and the logic die 23024 are electrically connected to each other through the single connection hole 23211.

Figure 17:
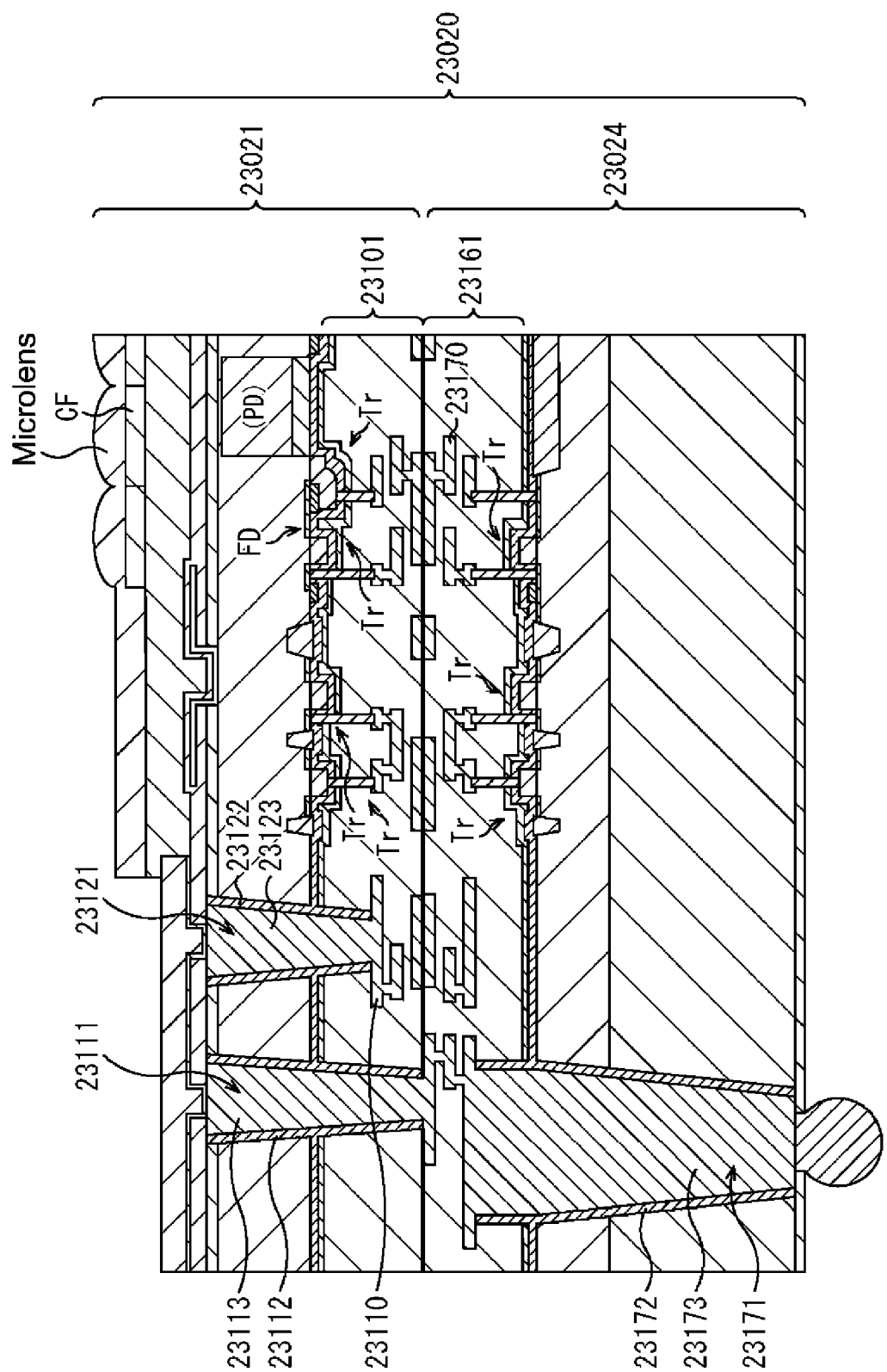
FIG. 17 is a cross-sectional view showing a third configuration example of the stacked-type solid-state imaging apparatus 23020.

FIG. 17 is a cross-sectional view showing a third configuration example of the stacked-type solid-state imaging apparatus 23020.

In the solid-state imaging apparatus 23020 of FIG. 17, the film 23191 such as the protection film is not formed in a face on which the sensor die 23021 and the logic die 23024 are bonded to each other. In the case of FIG. 15, the film 23191 such as the protection film is formed in the face on which the sensor die 23021 and the logic die 23024 are bonded to each other. In this point, the solid-state imaging apparatus 23020 of FIG. 17 is different from the case of FIG. 15.

The sensor die 23021 and the logic die 23024 are superimposed on each other such that the wires 23110 and 23170 are held in direct contact. Then, the wires 23110 and 23170 are directly joined with each other by heating the wires 23110 and 23170 while adding necessary weight on the wires 23110 and 23170. In this manner, the solid-state imaging apparatus 23020 of FIG. 17 is formed.

Figure 18:
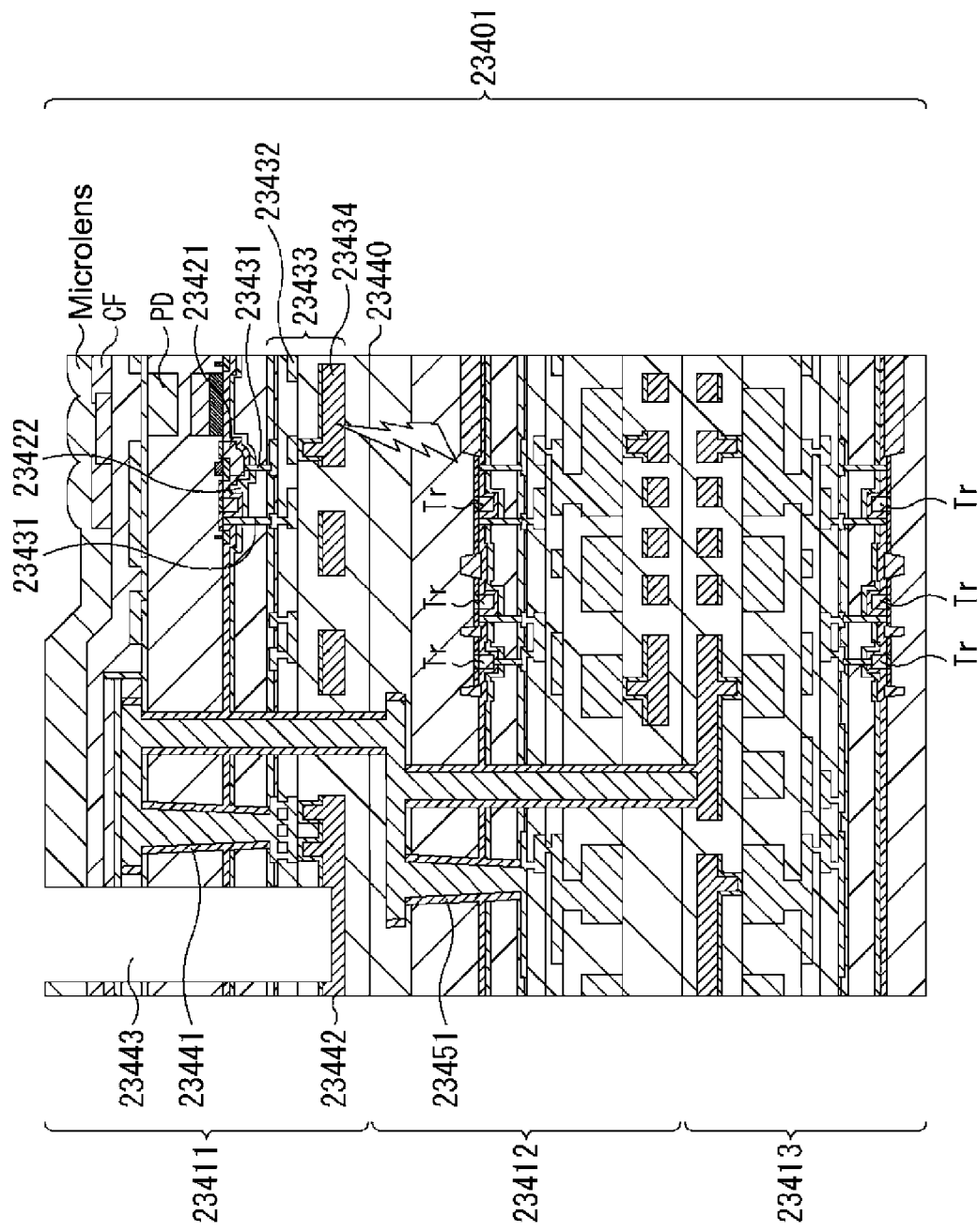
FIG. 18 is a cross-sectional view showing another configuration example of the stacked-type solid-state imaging apparatus to which the technology according to the present disclosure can be applied.

FIG. 18 is a cross-sectional view showing another configuration example of the stacked-type solid-state imaging apparatus to which the technology according to the present disclosure can be applied.

In FIG. 18, a solid-state imaging apparatus 23401 has a three-layer laminate structure. In this three-layer laminate structure, three dies of a sensor die 23411, a logic die 23412, and a memory die 23413 are stacked.

The memory die 23413 includes a memory circuit. The memory circuit stores data temporarily necessary in signal processing performed in the logic die 23412, for example.

In FIG. 18, the logic die 23412 and the memory die 23413 are stacked below the sensor die 23411 in the stated order. However, the logic die 23412 and the memory die 23413 may be stacked below the sensor die 23411 in inverse order, i.e., in the order of the memory die 23413 and the logic die 23412.

Note that, in FIG. 18, a PD that becomes a photoelectric conversion portion of the pixel and source/drain regions of a pixel Tr are formed in the sensor die 23411.

A gate electrode is formed via a gate insulation film around the PD. A pixel Tr 23421 and a pixel Tr 23422 are formed by the gate electrode and the paired source/drain regions.

The pixel Tr 23421 adjacent to the PD is a transfer Tr. One of the paired source/drain regions that constitute the pixel Tr 23421 is an FD.

Further, an inter-layer insulation film is formed in the sensor die 23411. A connection hole is formed in the inter-layer insulation film. The pixel Tr 23421 and connection conductors 23431 that connects to the pixel Tr 23422 are formed in the connection hole.

In addition, a wiring layer 23433 having a plurality of layers with layer wires 23432 which connect to each of the connection conductors 23431 is formed in the sensor die 23411.

Further, an aluminum pad 23434 that becomes an electrode for external connection is formed in a lowermost layer of the wiring layer 23433 of the sensor die 23411. That is, in the sensor die 23411, the aluminum pad 23434 is formed at a position closer to a surface 23440 bonding with the logic die 23412 than the wires 23432. The aluminum pad 23434 is used as one end of a wire associated with input/output of signals into/from the outside.

In addition, a contact 23441 used for electric connection with the logic die 23412 is formed in the sensor die 23411. The contact 23441 is connected to a contact 23451 of the logic die 23412 and also connected to an aluminum pad 23442 of the sensor die 23411.

Then, a pad hole 23443 is formed in the sensor die 23411, reaching the aluminum pad 23442 from a backside (upper side) of the sensor die 23411.

The technology according to the present disclosure can also be applied to the solid-state imaging apparatus as described above.

11. Example of Application to Electronic Apparatus

The technology according to the present disclosure is not limited to application to the solid-state imaging apparatus. Specifically, the technology according to the present disclosure is applicable to general electronic apparatuses each using the solid-state imaging apparatus in an image capturing portion (photoelectric conversion portion). The general electronic apparatuses include imaging apparatuses such as a digital still camera and a video camera, a portable terminal apparatus having an imaging function, a copy machine using the solid-state imaging apparatus in an image reader, and the like. The solid-state imaging apparatus may be in the form of one chip or may be in the form of a module having an imaging function in which an image capture unit and a signal processing unit or an optical system are packaged together.

Figure 19:
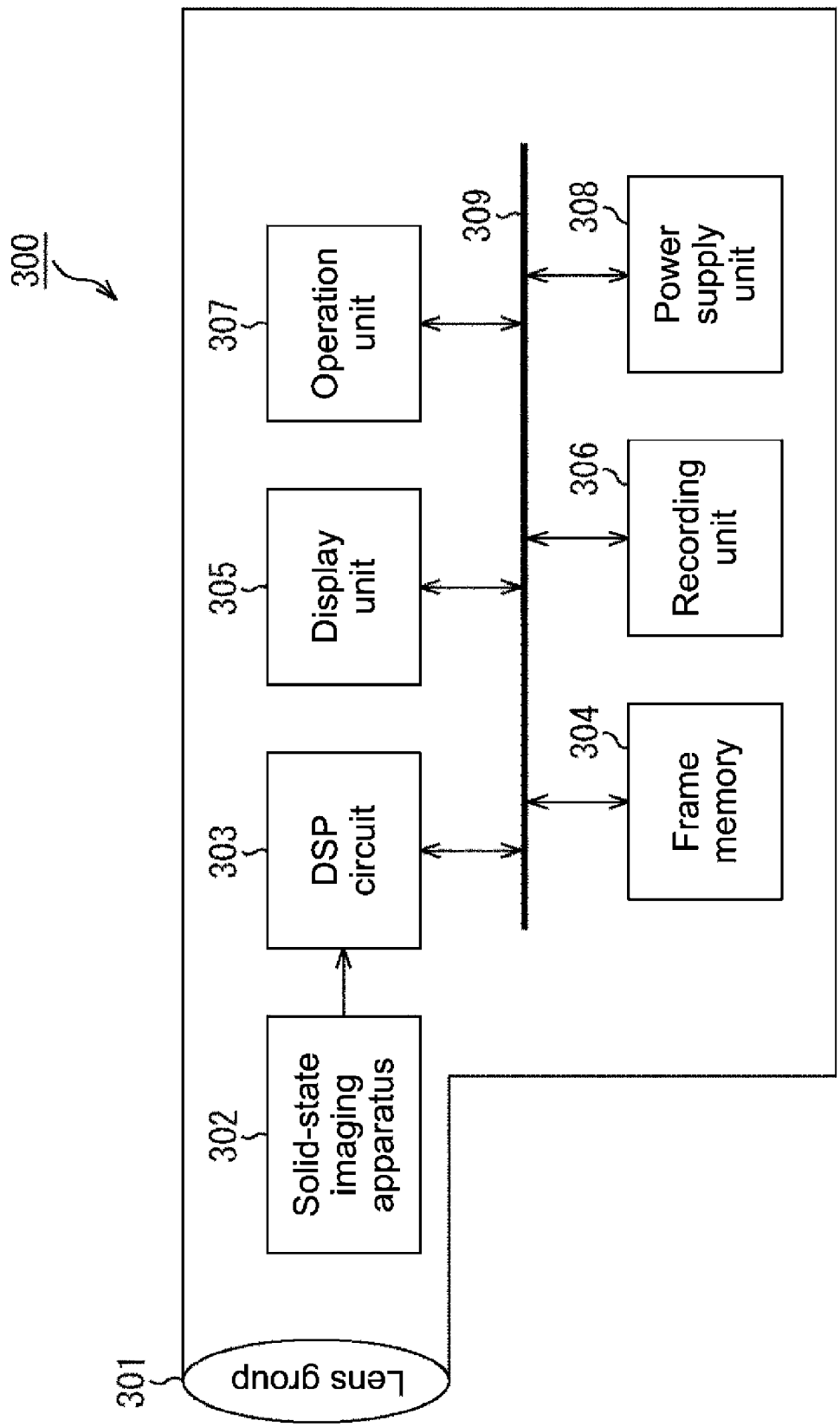

FIG. 19 is a block diagram showing a configuration example of an imaging apparatus serving as an electronic apparatus to which the technology according to the present disclosure is applied.

An imaging apparatus 300 of FIG. 19 includes an optical unit 301 formed of a lens group and the like, a solid-state imaging apparatus (imaging device) 302 in which the configuration of the solid-state imaging apparatus 1 of FIG. 1 is employed, and a digital signal processor (DSP) circuit 303 that is a camera signal processing circuit. Further, the imaging apparatus 300 also includes a frame memory 304, a display unit 305, a recording unit 306, an operation unit 307, and a power supply unit 308. The DSP circuit 303, the frame memory 304, the display unit 305, the recording unit 306, the operation unit 307, and the power supply unit 308 are connected to one another via a bus line 309.

The optical unit 301 captures incident light (image light) from an object and forms an image on an imaging surface of a solid-state imaging apparatus 302. The solid-state imaging apparatus 302 converts the amount of incident light, of which the image is formed on the imaging surface by the optical unit 301, into electric signals on a pixel-by-pixel basis and outputs them as pixel signals. The solid-state imaging apparatus 1 of FIG. 1, that is, the solid-state imaging apparatus having the pixel structure that suppresses inflow of electrons of dark current components generated at the STI bottom formed in each pixel into the photodiode is used as this solid-state imaging apparatus 302.

The display unit 305 includes, for example, a thin-type display such as a liquid crystal display (LCD) and an organic electro luminescence (EL) display. The display unit 305 displays moving images or still images captured by the solid-state imaging apparatus 302. The recording unit 306 records moving images or still images captured by the solid-state imaging apparatus 302 on a recording medium such as a hard disk and a semiconductor memory.

The operation unit 307 issues operation commands regarding various functions of the imaging apparatus 300 in accordance with user's operations. The power supply unit 308 appropriately supplies various power supplies that become operation power supplies for the DSP circuit 303, the frame memory 304, the display unit 305, the recording unit 306, and the operation unit 307 to these supply targets.

As described above, the solid-state imaging apparatus 1 including the pixels 2 according to any of the above-mentioned embodiments is used as the solid-state imaging apparatus 302. In this manner, inflow of electrons of dark current components under the pixel transistor into the photodiode can be suppressed while increasing the amount of charge handled of the photodiode. Thus, dark characteristics are excellent also in the imaging apparatus 300 such as a video camera or a digital still camera, and further a camera module for a mobile device such as a mobile phone. At the same time, the pixels having a larger amount of charge handled are provided. Therefore, the quality of captured images can be improved.

12. Usage Examples of Imaging Apparatus

Figure 20:
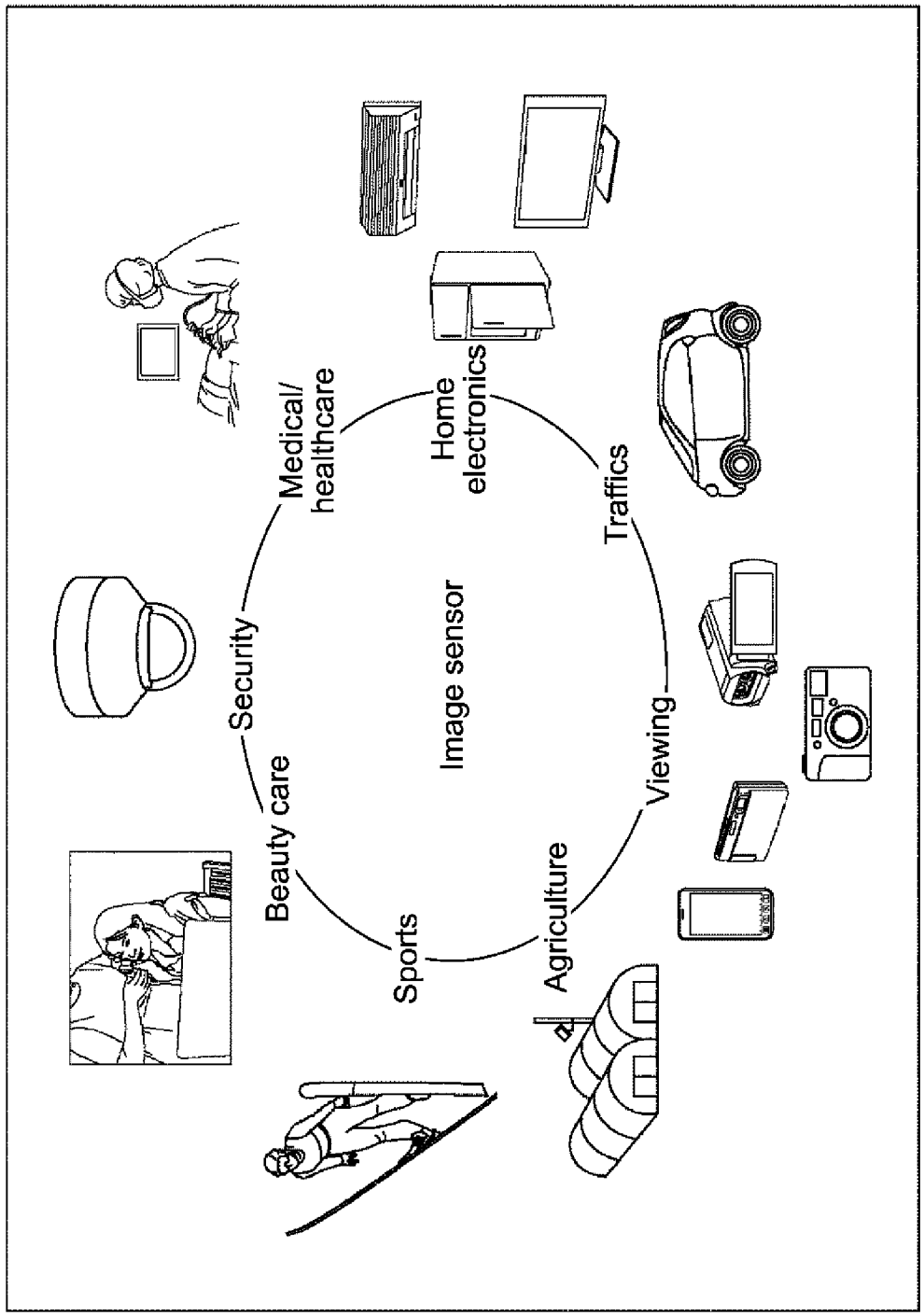
FIG. 20 is a diagram describing usage examples of an image sensor.

FIG. 20 is a diagram showing usage examples for using an image sensor using the above-mentioned solid-state imaging apparatus 1.

The image sensor using the above-mentioned solid-state imaging apparatus 1 can be used in various cases of sensing light such as visible light, infrared light, ultraviolet light, and X-rays as follows, for example.

An apparatus for photographing images to be viewed, such as a digital camera and a camera-equipped mobile apparatus An apparatus used for traffic purposes, such as a car-mounted sensor that photographs front/rear/periphery/inside of an automobile, a surveillance camera that monitors running vehicles and roads, and a distance measurement sensor that measures distances among vehicles, for safe driving including automatic stop, recognition of a driver condition, and the like An apparatus used in home electronics such as a TV, a refrigerator, and an air conditioner, for photographing gestures of users and executing apparatus operations according to the gestures An apparatus used for medical and healthcare purposes, such as an endoscope and an apparatus that performs blood vessel photographing by receiving infrared light An apparatus used for security purposes, such as a surveillance camera for crime-prevention purposes and a camera for person authentication purposes An apparatus used for beauty care purposes, such as a skin measurement apparatus that photographs skins and a microscope that photographs scalps An apparatus used for sports purposes, such as an action camera and a wearable camera for sports purposes An apparatus for agriculture purposes, such as a camera for monitoring states of fields and crops 13. Example of Application to Internal Information Acquisition System The technology according to the present disclosure (present technology) may be applied to various products. For example, the technology according to the present disclosure may be applied to an internal information acquisition system for a patient, which uses an endoscopic capsule.

Figure 21:
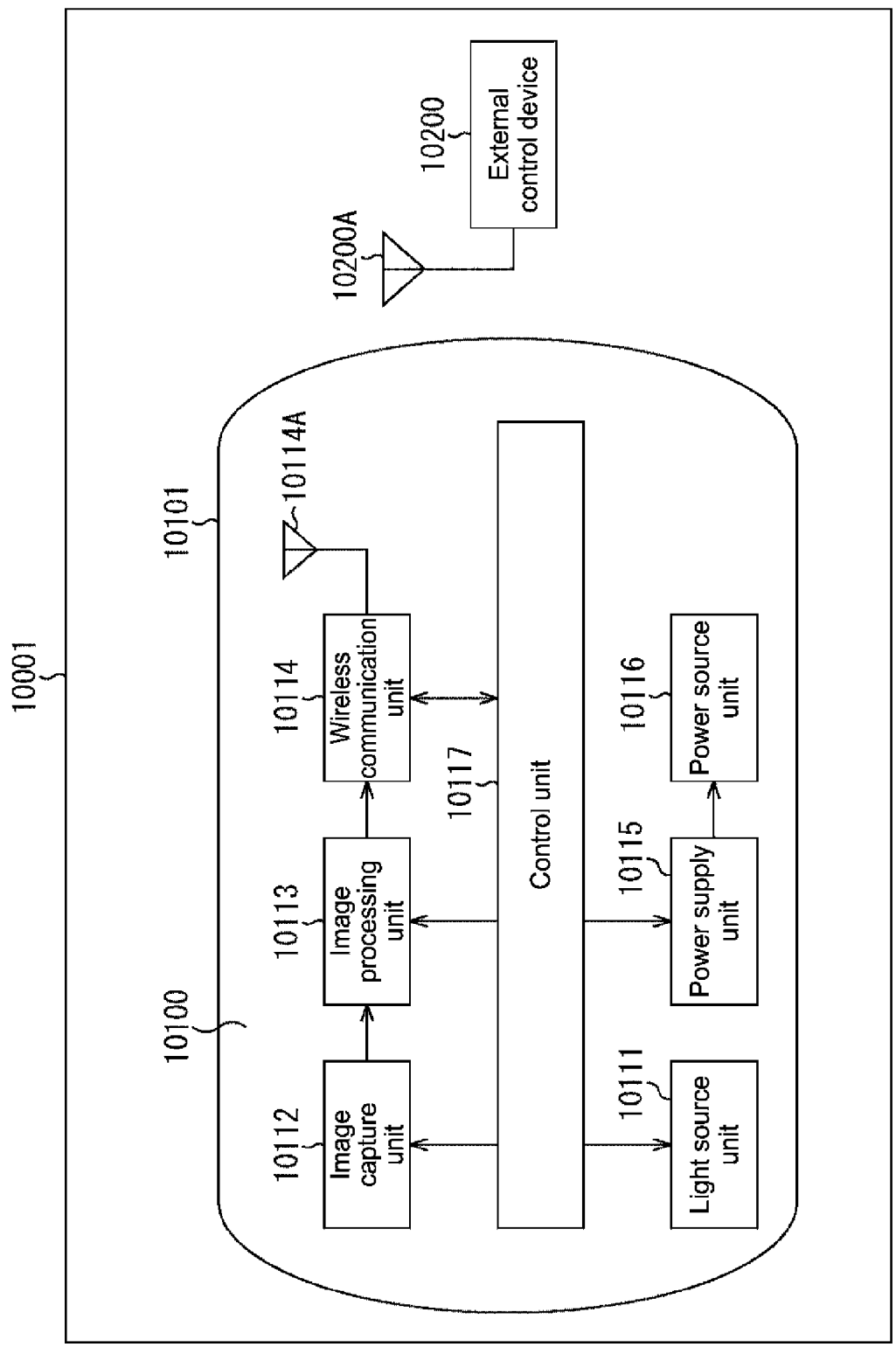
FIG. 21 is a block diagram showing an example of a schematic configuration of an internal information acquisition system.

FIG. 21 is a block diagram showing an example of a schematic configuration of an internal information acquisition system for a patient, which uses an endoscopic capsule, to which the technology according to the present disclosure may be applied.

An internal information acquisition system 10001 includes an endoscopic capsule 10100 and an external control device 10200.

The endoscopic capsule 10100 is swallowed by a patient in an examination. The endoscopic capsule 10100 has an image capture function and a wireless communication function. The endoscopic capsule 10100 moves through the interior of organs such as the stomach and the intestines by peristaltic movement or the like until being excreted naturally from the patient, while also successively capturing images (hereinafter, also referred to as internal images) of the interior of the relevant organs at predetermined intervals, and successively wirelessly transmitting information about the internal images to the external control device 10200 outside the body.

The external control device 10200 centrally controls the operation of the internal information acquisition system

10001. Further, the external control device 10200 receives information about the internal images transmitted from the endoscopic capsule 10100. Based on the received information about the internal images, the external control device 10200 generates image data for displaying the internal images on a display device (not shown).

In this way, with the internal information acquisition system 10001, images depicting the patient's internal conditions can be obtained continually from the time the endoscopic capsule 10100 is swallowed to the time the endoscopic capsule 10100 is excreted.

The configurations and functions of the endoscopic capsule 10100 and the external control device 10200 will be described in further detail.

The endoscopic capsule 10100 includes a capsule-shaped housing 10101, and includes a light source unit 10111, an image capture unit 10112, an image processing unit 10113, a wireless communication unit 10114, a power supply unit 10115, a power source unit 10116, and a control unit 10117 built in the capsule-shaped housing 10101.

The light source unit 10111 includes a light source such as a light-emitting diode (LED), for example, and irradiates the imaging field of the image capture unit 10112 with light.

The image capture unit 10112 includes an image sensor, and an optical system made up of multiple lenses provided in front of the image sensor. Reflected light (hereinafter, referred to as observation light) from the light radiated to a body tissue which is an object of observation is condensed by the optical system and incident on the image sensor. The image sensor of the image capture unit 10112 receives and photoelectrically converts the observation light, to thereby generate an image signal corresponding to the observation light. The image signal generated by the image capture unit 10112 is provided to the image processing unit 10113.

The image processing unit 10113 includes a processor such as a central processing unit (CPU) or a graphics processing unit (GPU), and performs various types of signal processing on the image signal generated by the image capture unit 10112. The image processing unit 10113 provides the image signal subjected to the signal processing to the wireless communication unit 10114 as raw data.

The wireless communication unit 10114 performs predetermined processing such as modulation processing on the image signal that was subjected to the signal processing by the image processing unit 10113, and transmits the image signal to the external control device 10200 via an antenna 10114A. In addition, the wireless communication unit 10114 receives, from the external control device 10200 via the antenna 10114A, a control signal related to driving control of the endoscopic capsule 10100. The wireless communication unit 10114 provides control signals received from the external control device 10200 to the control unit 10117.

The power supply unit 10115 includes, for example, an antenna coil for receiving power, a power regeneration circuit for regenerating power from a current produced in the antenna coil, and a voltage step-up circuit. In the power supply unit 10115, the principle of what is called contactless or wireless charging is used for generating power.

The power source unit 10116 includes a secondary battery, and stores power generated by the power supply unit 10115. FIG. 21 omits arrows or the like indicating the recipients of power from the power source unit 10116 for brevity, but power stored in the power source unit 10116 is supplied to the light source unit 10111, the image capture unit 10112, the image processing unit 10113, the wireless communication unit 10114, and the control unit 10117, and may be used for driving these components.

The control unit 10117 includes a processor such as a CPU. The control unit 10117 appropriately controls driving of the light source unit 10111, the image capture unit 10112, the image processing unit 10113, the wireless communication unit 10114, and the power supply unit 10115 in accordance with a control signal transmitted from the external control device 10200.

The external control device 10200 includes a processor such as a CPU and GPU, a microcomputer or a control board on which a processor and a storage element such as a memory are mounted, and the like. The external control device 10200 controls the operation of the endoscopic capsule 10100 by transmitting a control signal to the control unit 10117 of the endoscopic capsule 10100 via an antenna 10200A. In the endoscopic capsule 10100, for example, a light irradiation condition under which the light source unit 10111 irradiates a target of observation with light may be changed by a control signal from the external control device 10200. In addition, an image capture condition (such as the frame rate and the exposure level in the image capture unit 10112) may be changed by a control signal from the external control device 10200. In addition, the content of processing in the image processing unit 10113 and a condition (such as the transmission interval and the number of images to be transmitted) under which the wireless communication unit 10114 transmits the image signal may be changed by a control signal from the external control device 10200.

In addition, the external control device 10200 performs various types of image processing on the image signal transmitted from the endoscopic capsule 10100, and generates image data for displaying a captured internal image on a display device. For the image processing, various known signal processing, such as a development process (demosaicing process), an image quality-improving process (such as a band enhancement process, a super-resolution process, a noise reduction (NR) process, and/or a shake correction process), and/or an enlargement process (electronic zoom process), may be performed. The external control device 10200 controls driving of a display device (not shown), and causes the display device to display a captured internal image on the basis of the generated image data. Alternatively, the external control device 10200 may also cause a recording device (not shown) to record the generated image data, or cause a printing device (not shown) to make a printout of the generated image data.

The above describes an example of the internal information acquisition system to which the technology according to the present disclosure may be applied. The technology according to the present disclosure may be applied to the image capture unit 10112 of the above-mentioned configurations. By applying the technology according to the present disclosure to the image capture unit 10112, imaging with reduced dark current becomes possible while increasing the amount of charge handled. Therefore, it is possible to obtain a clearer surgical-site image and to enhance the accuracy of examination.

The internal information acquisition system for a patient using a capsule-type endoscope has been described as an example. Note that the technology according to the present disclosure may be applied to an endoscopic surgery system, a microscopic surgery system, and the like besides the internal information acquisition system for a patient.

14. Example of Application to Movable Object

The technology according to the present disclosure may be, for example, realized as a device mounted on any kind of movable objects such as a car, an electric car, a hybrid electric car, a motorcycle, a bicycle, a personal mobility, an aircraft, a drone, a ship, and a robot.

Figure 22:
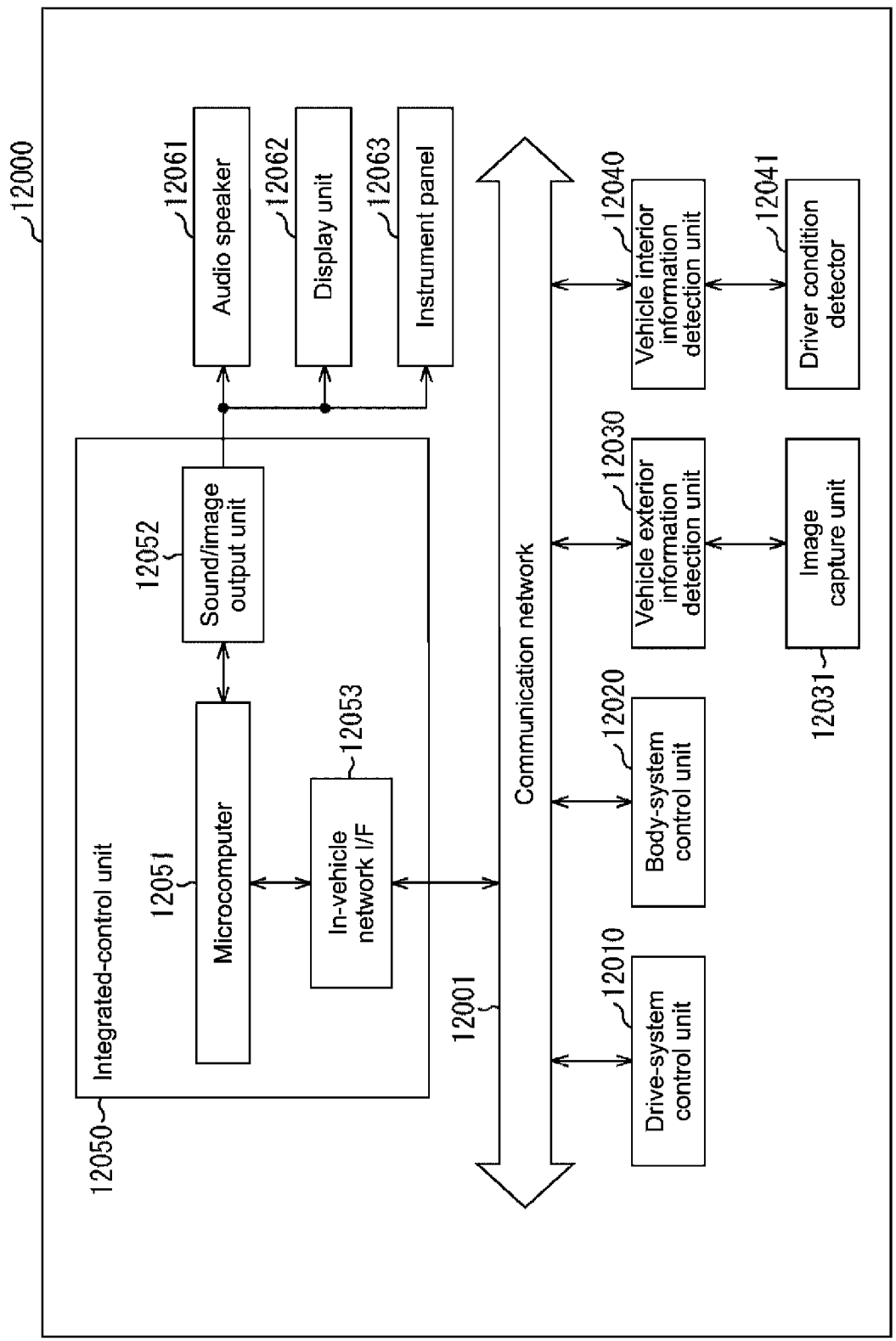
FIG. 22 is a block diagram showing an example of a schematic configuration of a vehicle control system.

FIG. 22 is a block diagram showing an example of a schematic configuration of a vehicle control system, which is an example of a movable object control system to which the technology according to the present disclosure is applied.

A vehicle control system 12000 includes a plurality of electronic control units connected to each other via a communication network 12001. In the example of FIG. 22, the vehicle control system 12000 includes a drive-system control unit 12010, a body-system control unit 12020, a vehicle exterior information detection unit 12030, a vehicle interior information detection unit 12040, and an integrated-control unit 12050. Further, as the functional configuration of the integrated-control unit 12050, a microcomputer 12051, a sound/image output unit 12052, and an in-vehicle network interface (I/F) 12053 are shown.

The drive-system control unit 12010 executes various kinds of programs, to thereby control the operations of the devices related to the drive system of the vehicle. For example, the drive-system control unit 12010 functions as a control device that controls driving force generation devices such as an internal-combustion engine and a driving motor for generating a driving force of the vehicle, a driving force transmission mechanism for transmitting the driving force to wheels, a steering mechanism that adjusts the steering angle of the vehicle, a brake device that generates a braking force of the vehicle, and the like.

The body-system control unit 12020 executes various kinds of programs, to thereby control the operations of the various kinds devices equipped in a vehicle body. For example, the body-system control unit 12020 functions as a control device that controls a keyless entry system, a smart key system, a power window device, or various lamps such as head lamps, back lamps, brake lamps, side-turn lamps, and fog lamps. In this case, an electric wave transmitted from a mobile device in place of a key or signals from various switches may be input in the body-system control unit 12020. The body-system control unit 12020 receives the input electric wave or signal, and controls a door lock device, the power window device, the lamps, and the like of the vehicle.

The vehicle exterior information detection unit 12030 detects information outside the vehicle including the vehicle control system 12000. For example, an image capture unit 12031 is connected to the vehicle exterior information detection unit 12030. The vehicle exterior information detection unit 12030 causes the image capture unit 12031 to capture an environment image and receives the captured image. The vehicle exterior information detection unit 12030 may perform an object detection process of detecting a man, a vehicle, an obstacle, a sign, a signage on a road, or the like on the basis of the received image, or may perform a distance detection process on the basis of the received image.

The image capture unit 12031 is an optical sensor that receives light and outputs an electric signal corresponding to the amount of light received. The image capture unit 12031 may output the electric signal as an image or may output as distance measurement information. Further, the light that the image capture unit 12031 receives may be visible light or invisible light such as infrared light.

The vehicle interior information detection unit 12040 detects vehicle interior information. For example, a driver condition detector 12041 that detects the condition of a driver is connected to the vehicle interior information detection unit 12040. For example, the driver condition detector 12041 may include a camera that captures an image of a driver. The vehicle interior information detection unit 12040 may calculate the fatigue level or the concentration level of the driver on the basis of the detected information input from the driver condition detector 12041, and may determine whether the driver is sleeping.

The microcomputer 12051 may calculate the control target value of the driving force generation device, the steering mechanism, or the brake device on the basis of the vehicle interior/vehicle exterior information obtained by the vehicle exterior information detection unit 12030 or the vehicle interior information detection unit 12040, and may output a control command to the drive-system control unit 12010. For example, the microcomputer 12051 may perform coordinated control for the purpose of realizing the advanced driver assistance system (ADAS) function including avoiding a vehicle collision, lowering impacts of a vehicle collision, follow-up driving based on a distance between vehicles, constant speed driving, vehicle collision warning, a vehicle's lane departure warning, or the like.

Further, by controlling the driving force generation device, the steering mechanism, the brake device, or the like on the basis of information about the environment around the vehicle obtained by the vehicle exterior information detection unit 12030 or the vehicle interior information detection unit 12040, the microcomputer 12051 may perform coordinated control for the purpose of realizing self-driving, i.e., autonomous driving without the need of drivers' operations, and the like.

Further, the microcomputer 12051 may output a control command to the body-system control unit 12020 on the basis of vehicle exterior information obtained by the vehicle exterior information detection unit 12030. For example, the microcomputer 12051 may perform coordinated control including controlling the head lamps on the basis of the location of a leading vehicle or an oncoming vehicle detected by the vehicle exterior information detection unit 12030 and changing high beams to low beams, for example, for the purpose of anti-glare.

The sound/image output unit 12052 transmits at least one of a sound output signal and an image output signal to an output device, which is capable of notifying a passenger of the vehicle or a person outside the vehicle of information visually or auditorily. In the example of FIG. 22, an audio speaker 12061, a display unit 12062, and an instrument panel 12063 are shown as examples of the output devices. For example, the display unit 12062 may include at least one of an on-board display and a head-up display.

Figure 23:
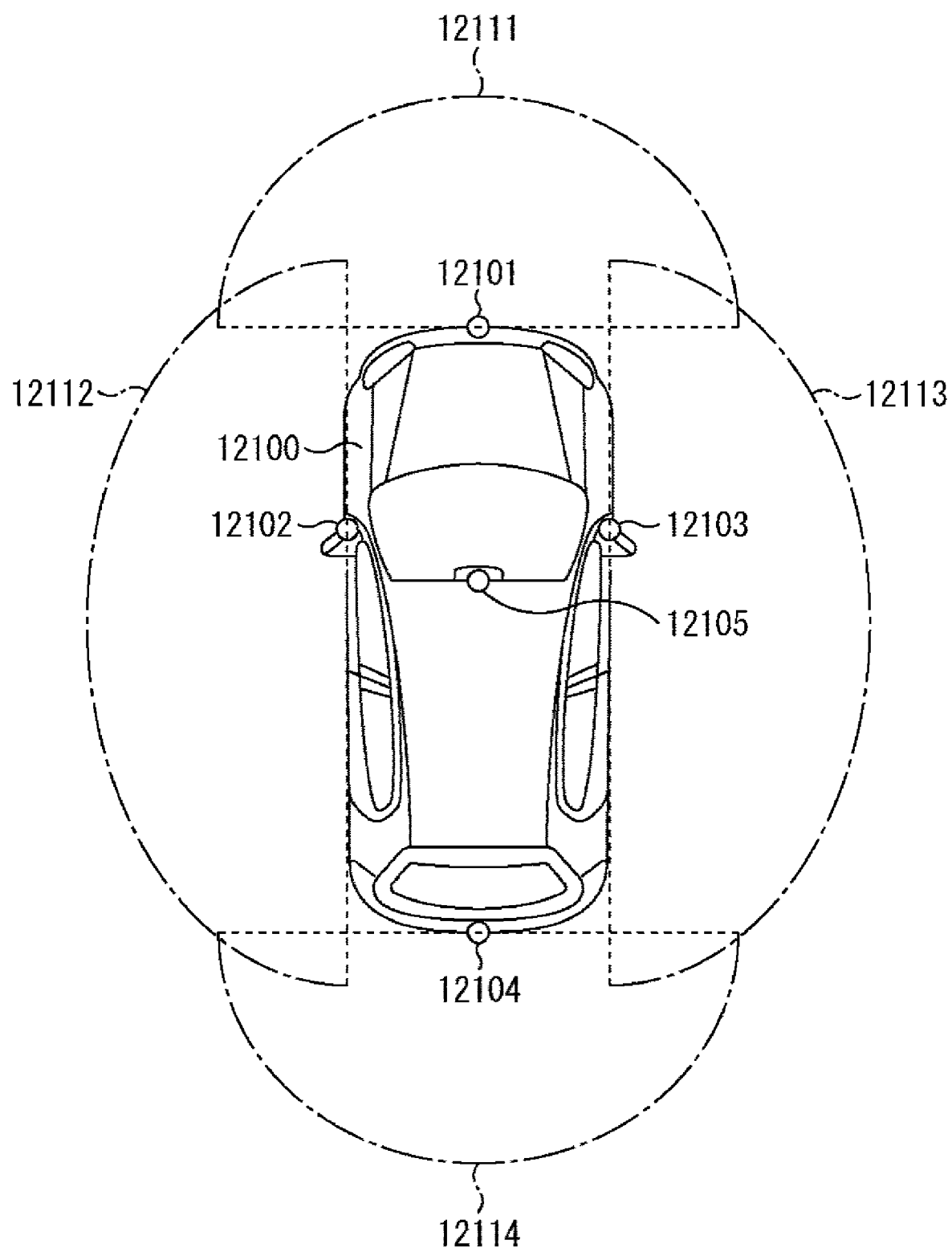
FIG. 23 is an explanatory diagram showing examples of mounting positions of a vehicle exterior information detector and image capture units.

FIG. 23 is a diagram showing examples of mounting positions of the image capture units 12031.

In FIG. 23, a vehicle 12100 includes, as the image capture units 12031, image capture units 12101, 12102, 12103, 12104, and 12105.

For example, the image capture units 12101, 12102, 12103, 12104, and 12105 are provided at positions such as the front nose, the side-view mirrors, the rear bumper or the rear door, and an upper part of the windshield in the cabin of the vehicle 12100. Each of the image capture unit 12101 on the front nose and the image capture unit 12105 on the upper part of the windshield in the cabin mainly obtains an image of the front of the vehicle 12100. Each of the image capture units 12102 and 12103 on the side-view mirrors mainly obtains an image of a side of the vehicle 12100. The image capture unit 12104 on the rear bumper or the rear door mainly obtains an image of the rear of the vehicle 12100.

The images of the front obtained by the image capture units 12101 and 12105 are mainly used for detecting a leading vehicle or detecting a pedestrian, an obstacle, a traffic light, a traffic sign, a lane, or the like.

Note that FIG. 23 shows examples of image capture ranges of the image capture units 12101 to 12104. The image capture range 12111 indicates the image capture range of the image capture unit 12101 on the front nose, the image capture ranges 12112 and 12113 indicate the image capture ranges of the image capture units 12102 and 12103 on the side-view mirrors, respectively, and the image capture range 12114 indicates the image capture range of the image capture unit 12104 on the rear bumper or the rear door. For example, by overlaying the image data captured by the image capture units 12101 to 12104 each other, a plane image of the vehicle 12100 as viewed from above is obtained.

At least one of the image capture units 12101 to 12104 may have a function of obtaining distance information. For example, at least one of the image capture units 12101 to 12104 may be a stereo camera including a plurality of image sensors or an image sensor including pixels for phase difference detection.

For example, by obtaining the distance between the vehicle 12100 and each three-dimensional (3D) object in the image capture ranges 12111 to 12114 and the temporal change (relative speed to the vehicle 12100) of the distance on the basis of the distance information obtained from the image capture units 12101 to 12104, the microcomputer 12051 may extract, as a leading vehicle, a 3D object which is especially the closest 3D object driving on the track on which the vehicle 12100 is driving at a predetermined speed (e.g., 0 km/h or more) in the direction substantially the same as the driving direction of the vehicle 12100. Further, by presetting a distance between the vehicle 12100 and a leading vehicle to be secured, the microcomputer 12051 may perform autobrake control (including follow-up stop control), automatic acceleration control (including follow-up start-driving control), and the like. In this way, it is possible to perform coordinated control for the purpose of realizing self-driving, i.e., autonomous driving without the need of drivers' operations, and the like.

For example, the microcomputer 12051 may sort 3D object data of 3D objects into motorcycles, standard-size vehicles, large-size vehicles, pedestrians, and the other 3D objects such as utility poles on the basis of the distance information obtained from the image capture units 12101 to 12104, extract data, and use the data to automatically avoid obstacles. For example, the microcomputer 12051 sorts obstacles around the vehicle 12100 into obstacles that a driver of the vehicle 12100 can see and obstacles that it is difficult for the driver to see. Then, the microcomputer 12051 determines a collision risk, which indicates a hazard level of a collision with each obstacle. When the collision risk is a preset value or more and when there is a possibility of a collision occurrence, the microcomputer 12051 may perform driving assistance to avoid a collision, in which the microcomputer 12051 outputs warning to the driver via the audio speaker 12061 or the display unit 12062, or mandatorily reduces the speed or performs collision-avoidance steering via the drive-system control unit 12010.

At least one of the image capture units 12101 to 12104 may be an infrared camera that detects infrared light. For example, the microcomputer 12051 may recognize a pedestrian by determining whether or not images captured by the image capture units 12101 to 12104 include the pedestrian. The method of recognizing a pedestrian includes, for example, the step of extracting characteristic points in the images captured by the image capture units 12101 to 12104 being infrared cameras, and the step of performing the pattern matching process with respect to a series of characteristic points indicating an outline of an object, to thereby determine whether or not the object is a pedestrian. Where the microcomputer 12051 determines that the images captured by the image capture units 12101 to 12104 include a pedestrian and recognizes the pedestrian, the sound/image output unit 12052 controls the display unit 12062 to display a rectangular contour superimposed on the recognized pedestrian to emphasize the pedestrian. Further, the sound/image output unit 12052 may control the display unit 12062 to display an icon or the like indicating a pedestrian at a desired position.

The above describes an example of the vehicle control system to which the technology according to the present disclosure may be applied. The technology according to the present disclosure may be applied to the image capture unit 12031 of the above-mentioned configurations. The image capture unit 12031, to which the technology according to the present disclosure is applied, is effective for downsizing the image capture unit 12031, obtaining a clearer captured image, and obtaining distance information. Further, by making use of obtained captured images and distance information, it is possible to reduce fatigue of a driver and improve safety of the driver and the vehicle.

Embodiments of the present technology are not limited to the above-mentioned embodiments but various modifications can be made without departing from the gist of the present technology.

For example, an embodiment in which all or some of the plurality of embodiments described above are combined may be employed.

In the above examples, the solid-state imaging apparatus using electrons as signal charges has been described assuming that the first conductivity type is the N-type and the second conductivity type is the P-type. However, the present technology can also be applied to a solid-state imaging apparatus using electron holes as signal charges. That is, each of the above-mentioned semiconductor regions may be a semiconductor region of an opposite conductivity type, assuming that the first conductivity type is the P-type and the second conductivity type is the N-type.

Further, the present technology is not limited to the solid-state imaging apparatus and is applicable to general semiconductor apparatuses having other semiconductor integrated circuits.

It should be noted that the effects described in the present specification are merely illustrative and not limitative and other effects may be given.

It should be noted that the present technology can also take the following configurations.

(1)

A solid-state imaging apparatus, including:

an element isolation region configured to isolate pixel transistors from each other, the pixel transistors being formed in a substrate interface of a semiconductor substrate; a charge storage region formed at a deeper position than the substrate interface; and a charge discharge layer of the same conductivity type as the charge storage region, the charge discharge layer being arranged between the element isolation region and the charge storage region.

(2)

The solid-state imaging apparatus according to (1), in which
the charge discharge layer is arranged directly below the element isolation region.

(3)

The solid-state imaging apparatus according to (1), in which
the charge discharge layer is arranged via a well region between the element isolation region and the charge storage region.

(4)

The solid-state imaging apparatus according to (1) or (3), in which
the charge discharge layer is also arranged below the pixel transistors other than a transfer transistor.

(5)

The solid-state imaging apparatus according to (1) or (2), in which
the charge discharge layer is not arranged below a gate electrode of the pixel transistors other than a transfer transistor.

(6)

The solid-state imaging apparatus according to any of (1) to (5), in which
the charge discharge layer is configured to be connected to a semiconductor region of the same conductivity type as the charge storage region formed in the substrate interface.

(7)

The solid-state imaging apparatus according to (6), in which
the semiconductor region is provided separately from a source region and a drain region of the pixel transistors.

(8)

The solid-state imaging apparatus according to (6), in which
the semiconductor region is a drain region of a reset transistor that is one of the pixel transistors.

(9)

The solid-state imaging apparatus according to (6), in which
the semiconductor region is a drain region of an amplification transistor that is one of the pixel transistors.

(10)

The solid-state imaging apparatus according to any of (6) to (9), in which
a predetermined voltage is constantly applied on the semiconductor region.

(11)

The solid-state imaging apparatus according to (6), in which
the semiconductor region is a semiconductor region between an amplification transistor and a selection transistor that are the pixel transistors.

(12)

The solid-state imaging apparatus according to any of (1) to (11), in which
a transfer transistor that is one of the pixel transistors is a transistor having a trench structure in which a gate electrode is formed extending from the substrate interface to the charge storage region.

(13)

The solid-state imaging apparatus according to any of (1) to (12), further including
an inter-pixel isolation section configured to penetrate the semiconductor substrate, the inter-pixel isolation section being arranged in a pixel boundary outside the charge storage region in a planar view.

(14)

The solid-state imaging apparatus according to (13), in which
the inter-pixel isolation section includes a double-layer structure of a sidewall film and a filler inside the sidewall film.

(15)

The solid-state imaging apparatus according to (13) or (14), further including
a P-type layer and an N-type layer configured to form a PN junction surface, the P-type layer and the N-type layer being arranged between the charge storage region and the inter-pixel isolation section.

(16)

The solid-state imaging apparatus according to any of (1) to (15), further including
a light-shielding film and an on-chip lens on a side of a second surface different from a first surface of the semiconductor substrate, in which the pixel transistors are formed.

(17)

An electronic apparatus, including
a solid-state imaging apparatus including
an element isolation region configured to isolate pixel transistors from each other, the pixel transistors being formed in a substrate interface of a semiconductor substrate, a charge storage region formed at a deeper position than the substrate interface, and a charge discharge layer of the same conductivity type as the charge storage region, the charge discharge layer being arranged between the element isolation region and the charge storage region.

(18)

An imaging device, comprising:
a plurality of pixel transistors at a substrate interface of a semiconductor substrate; an element isolation region that isolates the plurality of pixel transistors from each other;
a charge storage region at a deeper position in the semiconductor substrate than the substrate interface; and
a charge discharge layer of the same conductivity type as the charge storage region, wherein the charge discharge layer is arranged between the element isolation region and the charge storage region.

(19)

The imaging device according to (18), wherein the charge discharge layer is arranged below the element isolation region.

(20)

The imaging device according to (18), wherein the charge discharge layer is in a well region between the element isolation region and the charge storage region.

(21)

The imaging device according to (18), wherein the charge discharge layer is between the charge storage region and at least one of the plurality of pixel transistors that is not a transfer transistor.

(22)

The imaging device according to (18), wherein the charge discharge layer includes an opening, and a gate electrode of a transfer transistor in the plurality of pixel transistors extends through the opening into the charge storage region.

(23)
The imaging device according to (18), wherein the charge discharge layer is coupled to an impurity region having a same conductivity type as the charge storage region, wherein the impurity region is at the substrate interface.

(24)
The imaging device according to (23), wherein the impurity region is separate from a source region and a drain region of the plurality of pixel transistors.

(25)
The imaging device according to (23), wherein the impurity region is a drain region of a reset transistor of the plurality of pixel transistors.

(26)
The imaging device according to (23), wherein the impurity region is a drain region of an amplification transistor of the plurality of pixel transistors.

(27)
The imaging device according to (23), wherein the impurity region receives a predetermined voltage.

(28)
The imaging device according to (23), wherein the impurity region is between an amplification transistor and a selection transistor of the plurality of pixel transistors.

(29)
The imaging device according to (18), wherein a transfer transistor of the plurality of pixel transistors has a trench structure in which a gate electrode extends from the substrate interface to the charge storage region.

(30)
The imaging device according to (18), further comprising:
an inter-pixel isolation section configured to penetrate the semiconductor substrate, the inter-pixel isolation section being arranged in a pixel boundary outside the charge storage region in a planar view.

(31)
The imaging device according to (30), wherein the inter-pixel isolation section includes a double-layer structure of a sidewall film and a filler inside the sidewall film.

(32)
The imaging device according to (30), further comprising:
a P-type layer and an N-type layer configured to form a PN junction, the P-type layer and the N-type layer being arranged between the charge storage region and the inter-pixel isolation section.

(33)
The imaging device according to (18), further comprising:
a light-shielding film and an on-chip lens on a side of a surface of the semiconductor substrate that is different from a surface of the substrate interface.

(34)
An electronic apparatus, comprising:
an imaging device, including:
a plurality of pixel transistors at a substrate interface of a semiconductor substrate; an element isolation region that isolates the plurality of pixel transistors from each other;
a charge storage region at a deeper position in the semiconductor substrate than the substrate interface; and
a charge discharge layer of the same conductivity type as the charge storage region, wherein the charge discharge layer is arranged between the element isolation region and the charge storage region.

(35)
An imaging device, comprising:
a substrate;
a charge storage region in the substrate to store charge generated by incident light;
at least one transistor at a surface of the substrate and coupled to the charge storage region;
an isolation region in the substrate and located adjacent to at least one side of the at least one transistor; and
a charge discharge layer between the isolation region and the charge storage region, wherein the charge discharge layer discharges charge from the isolation region.

(36)
The imaging device of (35), further comprising:
an impurity region in the substrate and coupled to the charge discharge layer, wherein the isolation region is between the impurity region and the at least one transistor.

(37)
The imaging device of (36), wherein the impurity region, the charge storage region and the charge discharge layer have a same conductivity type, and wherein the impurity region has a higher impurity concentration than the charge discharge layer.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 Solid-state imaging apparatus
2 Pixel
12 Semiconductor substrate
42 Transfer transistor
44 Reset transistor
60 Backside interface
61 Light-shielding film
62 On-chip lens
71 N-type layer
72 Deep trench isolation (DTI)
73 P-type layer
74 N-type layer
75 P-type layer
81 Sidewall film
82 Filler
90 Frontside interface
91 P-well region (well region)
92 N-type layer
93 N-type diffusion layer
94, 95 STI
96 (96A, 96B) N-type diffusion layer
97 (97A to 97E) N-type layer
98 (98A, 98B) Drain terminal
121, 122 STI
300 Imaging apparatus
302 Solid-state imaging apparatus

What is claimed is:
1. An imaging device, comprising:
a plurality of pixel transistors at a surface of a semiconductor substrate;
an element isolation region that isolates the plurality of pixel transistors from each other;
a charge storage region at a deeper position in the semiconductor substrate than a substrate surface; and a charge discharge layer of the same conductivity type as the charge storage region,
wherein the charge discharge layer is arranged between the element isolation region and the charge storage region,
wherein the charge discharge layer is coupled to an impurity region having a same conductivity type as the charge storage region,
wherein the impurity region is at the substrate surface, and
wherein the impurity region is a drain region of at least one of a reset transistor or an amplification transistor of the plurality of pixel transistors.

2. The imaging device according to claim 1, wherein the charge discharge layer is arranged below the element isolation region.

3. The imaging device according to claim 1, wherein the charge discharge layer is in a well region between the element isolation region and the charge storage region.

4. The imaging device according to claim 1, wherein the charge discharge layer is between the charge storage region and at least one of the plurality of pixel transistors that is not a transfer transistor.

5. The imaging device according to claim 1, wherein the charge discharge layer includes an opening, and a gate electrode of a transfer transistor in the plurality of pixel transistors extends through the opening into the charge storage region.

6. The imaging device according to claim 1, wherein a transfer transistor of the plurality of pixel transistors has a trench structure in which a gate electrode extends from the substrate surface to the charge storage region.

7. The imaging device according to claim 1, further comprising:
an inter-pixel isolation section configured to penetrate the semiconductor substrate, the inter-pixel isolation section being arranged in a pixel boundary outside the charge storage region in a planar view.

8. The imaging device according to claim 1, further comprising:
a light-shielding film and an on-chip lens on a side of another surface of the semiconductor substrate that is different from a surface of the substrate surface.

9. An electronic apparatus, comprising an imaging device as defined in claim 1.

10. An imaging device, comprising:
a plurality of pixel transistors at a surface of a semiconductor substrate;
an element isolation region that isolates the plurality of pixel transistors from each other;
a charge storage region at a deeper position in the semiconductor substrate than a substrate surface; and
a charge discharge layer of the same conductivity type as the charge storage region,
wherein the charge discharge layer is arranged between the element isolation region and the charge storage region,
wherein the charge discharge layer is coupled to an impurity region having a same conductivity type as the charge storage region,
wherein the impurity region is at the substrate surface, and
wherein the impurity region is a drain region of an amplification transistor of the plurality of pixel transistors.

11. The imaging device according to claim 10, wherein the charge discharge layer is arranged below the element isolation region.

12. The imaging device according to claim 10, wherein the charge discharge layer is in a well region between the element isolation region and the charge storage region.

13. The imaging device according to claim 10, wherein the charge discharge layer is between the charge storage region and at least one of the plurality of pixel transistors that is not a transfer transistor.

14. An imaging device, comprising:
a plurality of pixel transistors at a surface of a semiconductor substrate;
an element isolation region that isolates the plurality of pixel transistors from each other;
a charge storage region at a deeper position in the semiconductor substrate than a substrate surface; and
a charge discharge layer of the same conductivity type as the charge storage region,
wherein the charge discharge layer is arranged between the element isolation region and the charge storage region,
wherein the charge discharge layer is coupled to an impurity region having a same conductivity type as the charge storage region,
wherein the impurity region is at the substrate surface, and
wherein the impurity region receives a predetermined voltage (VDD).

15. An imaging device, comprising:
a plurality of pixel transistors at a surface of a semiconductor substrate;
an element isolation region that isolates the plurality of pixel transistors from each other;
a charge storage region at a deeper position in the semiconductor substrate than a substrate surface; and
a charge discharge layer of the same conductivity type as the charge storage region,
wherein the charge discharge layer is arranged between the element isolation region and the charge storage region,
wherein the charge discharge layer is coupled to an impurity region having a same conductivity type as the charge storage region,
wherein the impurity region is at the substrate surface, and
wherein the impurity region is between an amplification transistor and a selection transistor of the plurality of pixel transistors.

16. An imaging device, comprising:
a plurality of pixel transistors at a surface of a semiconductor substrate;
an element isolation region that isolates the plurality of pixel transistors from each other;
a charge storage region at a deeper position in the semiconductor substrate than a substrate surface;
a charge discharge layer of the same conductivity type as the charge storage region; and
an inter-pixel isolation section configured to penetrate the semiconductor substrate,
wherein the inter-pixel isolation section is arranged in a pixel boundary outside the charge storage region in a planar view,
wherein the charge discharge layer is arranged between the element isolation region and the charge storage region, and
wherein the inter-pixel isolation section includes a double-layer structure of a sidewall film and a filler inside the double-layer structure of the sidewall film.

17. The imaging device according to claim 16, wherein the charge discharge layer is coupled to an impurity region having a same conductivity type as the charge storage region, wherein the impurity region is at the substrate surface.

18. The imaging device according to claim 16, wherein the impurity region is separate from a source region and a drain region of the plurality of pixel transistors.

19. An imaging device, comprising:
- a plurality of pixel transistors at a surface of a semiconductor substrate;
- an element isolation region that isolates the plurality of pixel transistors from each other;
- a charge storage region at a deeper position in the semiconductor substrate than a substrate surface;
- a charge discharge layer of the same conductivity type as the charge storage region, wherein the charge discharge layer is arranged between the element isolation region and the charge storage region;
- an inter-pixel isolation section configured to penetrate the semiconductor substrate, wherein the inter-pixel isolation section is arranged in a pixel boundary outside the charge storage region in a planar view; and
- a P-type layer and an N-type layer configured to form a PN junction, the P-type layer and the N-type layer being arranged between the charge storage region and the inter-pixel isolation section.

20. An imaging device, comprising:
- a substrate;
- a charge storage region in the substrate to store charge generated by incident light;
- at least one transistor at a surface of the substrate and coupled to the charge storage region;
- an isolation region in the substrate and located adjacent to at least one side of the at least one transistor; and
- a charge discharge layer between the isolation region and the charge storage region, wherein the charge discharge layer discharges charge from the isolation region;
- an impurity region in the substrate and coupled to the charge discharge layer, wherein the isolation region is between the impurity region and the at least one transistor,
- wherein the impurity region, the charge storage region and the charge discharge layer have a same conductivity type, and
- wherein the impurity region has a higher impurity concentration than the charge discharge layer.

* * * * *